US012712039B2

(12) United States Patent
Bajic et al.

(10) Patent No.: US 12,712,039 B2
(45) Date of Patent: Aug. 18, 2026

(54) MULTIBIT HIGH DENSITY READ ONLY MEMORY USING MULTIPLE REFERENCE BIASES

(71) Applicant: Taalas Inc., Toronto (CA)

(72) Inventors: Ljubisa Bajic, Toronto (CA); Lejla Bajic, North York (CA); Dragoljub Ignjatovic, North York (CA)

(73) Assignee: TAALAS INC. (CA)

( * ) Notice: Subject to any disclaimer, the term of this patent is extended or adjusted under 35 U.S.C. 154(b) by 0 days.

(21) Appl. No.: 18/776,254

(22) Filed: Jul. 18, 2024

(65) Prior Publication Data

US 2025/0029669 A1 Jan. 23, 2025

Related U.S. Application Data

(60) Provisional application No. 63/540,362, filed on Sep. 25, 2023, provisional application No. 63/527,825, filed on Jul. 20, 2023.

(51) Int. Cl.

| | |
|---|---|
| ***G11C 17/16*** | (2006.01) |
| ***G11C 5/14*** | (2006.01) |
| ***G11C 7/10*** | (2006.01) |
| ***G11C 7/12*** | (2006.01) |
| ***G11C 7/22*** | (2006.01) |
| ***G11C 17/18*** | (2006.01) |

(52) U.S. Cl.

CPC .............. *G11C 17/18* (2013.01); *G11C 5/147* (2013.01); *G11C 7/1051* (2013.01); *G11C 7/12* (2013.01); *G11C 7/22* (2013.01); *G11C 17/16* (2013.01)

(58) Field of Classification Search

CPC ....... G11C 17/18; G11C 5/147; G11C 7/1051; G11C 7/12; G11C 7/22; G11C 17/16; G11C 11/54

See application file for complete search history.

(56) References Cited

U.S. PATENT DOCUMENTS

| | | | | |
|---|---|---|---|---|
| 3,028,659 | A | 4/1962 | Wen et al. | |
| 5,078,498 | A * | 1/1992 | Kadakia ................ | H10B 69/00 257/E29.302 |

(Continued)

OTHER PUBLICATIONS

International Search Report and Written Opinion for International Patent Application No. PCT/IB2024/057051, dated Oct. 23, 2024 (7 pages).

(Continued)

*Primary Examiner* — Xiaochun L Chen

(74) *Attorney, Agent, or Firm* — Goodwin Procter LLP

(57) ABSTRACT

Methods and systems which involve computer memories are disclosed herein. A disclosed multibit read only memory (ROM) includes a plurality of voltage generators for generating a plurality of voltages and a transistor having a first node and a second node. The transistor can be a field effect transistor (FET) and the first node can be a gate node and the second node can be a source or drain node. The ROM includes a connection from the first node to a first supply voltage node which is biased by one of the voltages in the plurality of voltages. The ROM includes a connection from the second node to a second supply voltage node which is biased by one of the voltages in the plurality of voltages. The value of a multibit ROM cell in the multibit ROM is stored as a resulting conductivity state of the transistor.

31 Claims, 11 Drawing Sheets

(56) References Cited

U.S. PATENT DOCUMENTS

| | | | | |
|---|---|---|---|---|
| 5,732,035 | A | 3/1998 | Komarek et al. | |
| 6,075,725 | A * | 6/2000 | Choi | G11C 17/12 365/185.24 |
| 6,504,750 | B1 * | 1/2003 | Baker | G11C 13/0061 365/233.17 |
| 6,822,889 | B2 | 11/2004 | Chen et al. | |
| 7,567,450 | B2 | 7/2009 | Kim | |
| 7,936,578 | B2 | 5/2011 | Nevers et al. | |
| 8,611,128 | B2 | 12/2013 | Pelley | |
| 8,760,333 | B2 * | 6/2014 | Op 't Eynde | H03M 1/0682 331/11 |
| 8,837,192 | B2 | 9/2014 | Wu et al. | |
| 9,318,195 | B1 | 4/2016 | Ryu et al. | |
| 9,691,496 | B1 * | 6/2017 | Kohli | G11C 11/5692 |
| 11,016,701 | B2 * | 5/2021 | Young | G06F 3/0604 |
| 2006/0120133 | A1 * | 6/2006 | Star Sung | G11C 11/5692 365/94 |
| 2020/0151539 | A1 * | 5/2020 | Oh | G11C 16/08 |
| 2023/0110738 | A1 | 4/2023 | Shlomo et al. | |

OTHER PUBLICATIONS

W. Cui et al. (2007). Design of Small Area and Low Power Consumption Mask ROM. 2007 IEEE International Conference on Integrated Circuit Design and Technology, 1-4.

* cited by examiner

Word line 104
101
Reference Voltage 105
100
Bit line 103

300
Provide a plurality of voltage regulators for generating a plurality of voltages for a multibit ROM.
310
Write to the ROM memory cell by biasing the transistor with the reference voltages
311
Connecting a first node of a transistor to a first supply voltage node
312
Connect a second node of the transistor to a second supply voltage node
313
301
307
V_DD_0
V_DD_1
V_DD_2
V_DD_N
305
Word Line 304
Bit Line 303
302
306

700
$V_{DD\_IN}$
Digital LDO (Regulator)
Digital LDO (Regulator)
Digital LDO (Regulator)
Digital LDO (Regulator)
$V_{REF0}$
$V_{REF1}$
$V_{REF2}$
$V_{REFN}$
Bit Line 702
703
705
707

MULTIBIT HIGH DENSITY READ ONLY MEMORY USING MULTIPLE REFERENCE BIASES

CROSS REFERENCE TO RELATED APPLICATIONS

This application claims the benefit of U.S. Provisional Patent Application No. 63/540,362, filed Sep. 25, 2023, and U.S. Provisional Patent Application No. 63/527,825, filed Jul. 20, 2023, both of which are incorporated by reference herein in their entireties for all purposes.

BACKGROUND

The development of read-only memory (ROM) has been an important aspect of the development of computational systems. The origins of ROM can be traced back to the early days of electronic computers in the mid-20th century. Initially, ROM was implemented using physical methods like diode matrices or wire jumpers to encode fixed instructions and data directly into the hardware of these early machines. As computing technology advanced, ROM took on various forms, including mask ROM, in which the data held by the ROM was formed by a pattern etched onto an integrated circuit using masks during the fabrication of the integrated circuit. In these systems, the masks used to etch the patterns could be changed to create different memory states for different versions of the hardware.

ROM that can be modified after it is formed is often referred to as programmable ROM (PROM). The first PROMs were invented in in the mid-1950s with U.S. Pat. No. 3,028,659 to Wen Tsing Chow serving as an early example. This patent preceded the widespread adoption of field effect transistors (FETs). As such, the data in early PROMs was stored using other devices such as diodes. Each PROM diode was a cell of the memory which could either be ruptured through the application of high current to program in a zero value or be left alone for the cell to represent a one value. The diode can be referred to as the storage element in this example because the state of the diode determines the value stored by the associated memory cell.

Later PROMs utilized FETs as the storage element for the memory. FIG. 1 illustrates a standard FET ROM cell in which a source or drain node of a FET is either connected to a supply voltage or a refence voltage. The cell is read by monitoring the current on the bit line when a control signal is sent to the word line. Relative to other types of memories such as erasable programmable ROM (EPROM) or random-access memory (RAM), mask ROM and PROM have high densities since little else is needed besides a single storage element.

SUMMARY

Methods and systems which involve computer memories are disclosed herein. More specifically, methods and systems which involve ROMs are disclosed herein. The ROMs can be multibit ROMs which store more than one bit of information per memory cell.

A value of the multibit ROM cells can be stored as a connectivity state of a circuit element such as a transistor. The connectivity state can be set by connecting the circuit elements to different nodes. In specific embodiments, the connectivity state of the element will define a conductivity state of the circuit element such that the value of the multibit ROM cells can be stored as the conductivity state of a circuit element such as a transistor. The conductivity state of the circuit element can be set by applying different biases to the circuit elements such as bias voltages or bias currents. The multibit ROM cells can be multibit cells because each circuit element may be capable of being connected to different nodes. For example, one of a plurality of nodes can be connected to the circuit element at a given time with each of those plurality of nodes placing the circuit element into a different connectivity state. As another example, one of a plurality of biases can be connected to the circuit element at a given time with each of those plurality of voltages placing the circuit element into a different conductivity state. The plurality of biases can be generated by a plurality of bias generators such as a plurality of voltage generators or voltage regulators.

In specific embodiments, the circuit element can include multiple terminals that can impact the conductivity state of the circuit element. For example, the circuit element could include at least two terminals and different biases could be programmatically connected independently to the at least two terminals. The circuit element may be configured such that the different combinations of potential biases each set the circuit element into a unique conductivity state. In these embodiments, the number of conductivity states can be significantly increased and, in the alternative or in combination, the information density of a memory cell can be increased without an increase in the number of bias generators.

In specific embodiments of the inventions disclosed herein, a read circuit for the multibit ROM can provide a sensed current or voltage signal to a neural network. The neural network can be integrated with the multibit ROM and can be trained on the multibit ROM. As such, the neural network can be trained to filter out the noise from the multibit ROM and determine the true values that were meant to be stored in the multibit ROM. In embodiments in which the value is stored as a conductivity state of the circuit element where the nodes to which the circuit element are connected are reference voltage or reference currents, such an approach can be beneficial in that the independent noise sources are likely to be fewer than the number of memory cells in the memory such that the neural network can be kept appreciable small while still learning to filter out all of the noise of the system. Furthermore, since the multibit values of the memory are stored and read as analog signals which are approximately equivalent to the reference voltage or reference currents, the noise on the signals will not be amplified by the barrier between adjacent digital values, and a neural network will be better able to learn and filter out the noise on those analog signals.

In specific embodiments of the inventions disclosed herein, by using a plurality of biases, a single circuit element can store multiple bits in place of a similar circuit element which would otherwise have stored a single bit of information in a traditional ROM cell. ROM arrays in accordance with these embodiments can exhibit much higher information densities as compared to traditional ROM arrays. For example, using the embodiments disclosed herein it is estimated that hundreds of gigabits of integrated ROM storage could be provided on an integrated circuit in close proximity to the computational elements of the integrated circuit. The integration can be made even more beneficial because the circuit elements for the ROM cells can be the same high speed logic transistors used for the computational elements of the integrated circuit. This means that the circuit elements for the ROM cells can be multibit but do not necessarily need to be placed in a separate part of the chip such as in a specialized well or power island. In applications such as machine intelligence inference applications in which a large number of parameters representing a trained machine intelligence network must be stored in ROM in order to conduct the complex computations necessary to generate those inferences, this degree of integration and information density can be particularly beneficial.

In specific embodiments of the invention, a method is provided. The method comprises: providing a plurality of voltage regulators for generating a plurality of voltages for a multibit read only memory; and connecting a first node of a transistor to a first supply voltage node, wherein the first supply voltage node is biased by one of the voltages in the plurality of voltages, wherein the transistor is in a multibit read only memory cell of the multibit read only memory, and whereby a value of the multibit read only memory cell is stored as a connectivity state of the transistor.

In specific embodiments of the invention, a multibit read only memory is provided. The multibit read only memory comprises: a plurality of voltage generators for generating a plurality of voltages; a transistor having a first node and a second node; and a connection from the first node to a first supply voltage node. The first supply voltage node is biased by one of the voltages in the plurality of voltages. The value of a multibit read only memory cell in the multibit read only memory is stored as a connectivity state of the transistor.

In specific embodiments of the invention, a method is provided. The method comprises: providing a plurality of voltage regulators for generating a plurality of voltages for a multibit read only memory; and connecting a first node of a transistor to a first supply voltage node. The first supply voltage node is biased by one of the voltages in the plurality of voltages. The transistor is in a multibit read only memory cell of the multibit read only memory. The method also comprises connecting a second node of the transistor to a second supply voltage node. The second supply voltage node is biased by one of the voltages in the plurality of voltages. Using the above steps, a value of the multibit read only memory cell is stored as a conductivity state of the transistor.

In specific embodiments of the invention, a multibit read only memory is provided. The multibit read only memory comprises: a plurality of voltage generators for generating a plurality of voltages; a transistor having a first node and a second node; and a connection from the first node to a first supply voltage node. The first supply voltage node is biased by one of the voltages in the plurality of voltages. The memory also comprises a connection from the second node to a second supply voltage node. The second supply voltage node is biased by one of the voltages in the plurality of voltages. The value of a multibit read only memory cell in the multibit read only memory is stored as a conductivity state of the transistor.

BRIEF DESCRIPTION OF THE DRAWINGS

The accompanying drawings illustrate various embodiments of systems, methods, and various other aspects of the disclosure. A person with ordinary skills in the art will appreciate that the illustrated element boundaries (e.g., boxes, groups of boxes, or other shapes) in the figures represent one example of the boundaries. It may be that in some examples one element may be designed as multiple elements or that multiple elements may be designed as one element. In some examples, an element shown as an internal component of one element may be implemented as an external component in another and vice versa. Furthermore, elements may not be drawn to scale. Non-limiting and non-exhaustive descriptions are described with reference to the following drawings. The components in the figures are not necessarily to scale, emphasis instead being placed upon illustrating principles.

DETAILED DESCRIPTION

Figure 1:
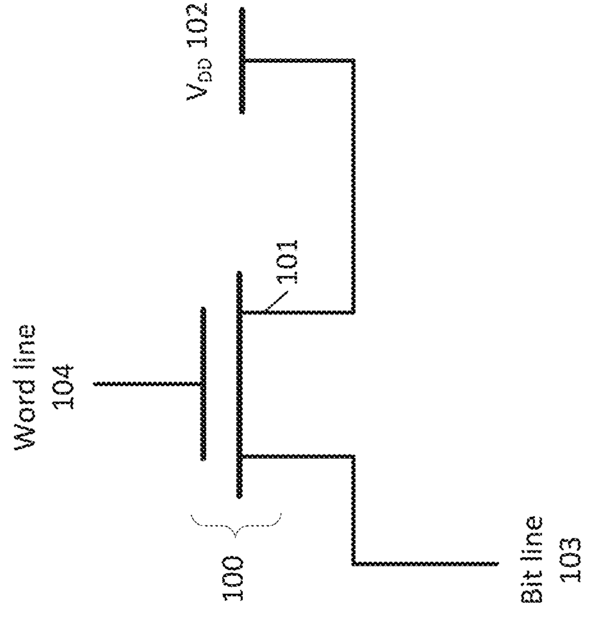
FIG. 1 illustrates a read only memory (ROM) cell in accordance with the related art.

Reference will now be made in detail to implementations and embodiments of various aspects and variations of systems and methods described herein. Although several exemplary variations of the systems and methods are described herein, other variations of the systems and methods may include aspects of the systems and methods described herein combined in any suitable manner having combinations of all or some of the aspects described.

Different methods and systems which involve computer memories are disclosed in detail herein. The methods and systems disclosed in this section are nonlimiting embodiments of the invention, are provided for explanatory purposes only, and should not be used to constrict the full scope of the invention. It is to be understood that the disclosed embodiments may or may not overlap with each other. Thus, part of one embodiment, or specific embodiments thereof, may or may not fall within the ambit of another, or specific embodiments thereof, and vice versa. Different embodiments from different aspects may be combined or practiced separately. Many different combinations and sub-combinations of the representative embodiments shown within the broad framework of this invention, that may be apparent to those skilled in the art but not explicitly shown or described, should not be construed as precluded.

In specific embodiments of the invention, the value of a multibit ROM cell is stored as a connectivity state of a circuit element. In specific embodiments of the invention, the value of the multibit ROM cell is stored as a conductivity state of a circuit element. The circuit element can exhibit various connectivity states or conductivity states with each state being associated with a value. As such, the circuit element can serve as the storage medium for a multibit ROM cell. The various states of the circuit element can be set by applying different biases to the circuit element or by adjusting the physical characteristics of the transistor (e.g., by modifying a diffusion layer of the transistor). The application of different biases or the adjustments to the physical characteristics of the transistor can be conducted as the circuit is being built using different masks or can be conducted after the circuit has been built using programmable media such as fuses. As such, the circuit element can serve as a programmable storage medium for a multibit ROM cell where programming the multibit ROM cell comprises supplying those different biases to the circuit element.

The circuit elements for which a state is associated with a value stored in the multibit ROM memory can be referred to as storage elements. The storage elements can be active or passive devices. The storage elements could be diodes, field effect transistors such as metal insulator field effect transistors, junction field effect transistors, bipolar junction transistors, and other circuit elements. A storage element in the form of a transistor can be referred to as a storage transistor.

A state of the storage elements can be set by applying different biases to one or more terminals of the storage elements. A state of the storage elements can be set by fabricating the device using different dopant levels or dimensions as the device is being fabricated. In this disclosure, the example of different supply voltages being applied to a circuit element is used in most examples. However, programming through the application of a supply voltage as opposed to a supply current is not a limitation of all the embodiments disclosed herein as storage elements that receive supply currents to place them into specific states can be used in specific embodiments of the inventions disclosed herein. As such, the term "receiving a bias" as used herein refers to either receiving a voltage or a current used to bias a device. The biases can be controllably applied to the circuit elements to alter the state of the circuit element and thereby change the value stored by the circuit element. The controllable setting of the state of the circuit element can be conducted using configurable mask layers of the memory to program the device as it is being fabricated, or antifuse elements, fuse elements, or other technologies used in ROM or PROM applications to program the memory after it has been fabricated.

The circuit elements can include various terminals. The terminals can be terminals that receive a programmable bias and that, when biased by a specific voltage or current, set a state of the circuit elements. The terminals can be referred to as program terminals. The terminals can alternatively or in combination be terminals by which the state of the circuit element is defined (e.g., the state can refer to the impedance between two terminals). Such terminals can be referred to as the state terminals. The two types of terminals can overlap or be separate. As an example of overlapping sets of terminals, the circuit element could be a transistor with the conductivity between the source and drain of the transistor defining the conductivity state of the transistor (i.e., the source and drain are the state terminals), and the terminals that are biased by a programmable bias could be an overlapping set of terminals comprising the drain of the transistor and the gate of the transistor (i.e., the drain and gate are the program terminals). As an example of nonoverlapping sets of terminals, the circuit element could be a transistor with the conductivity between the source and drain of the transistor defining the conductivity of the transistor, and the terminals that are biased by a programmable bias could be the gate and body of the transistor. In this example, the drain and source would still be biased in order to read the conductivity state of the transistor, but they would not be biased by programmable biases as are the gate and body in this example.

Storage elements can have a variety of different states based on a number of different fabrication flows used to fabricate the device itself as opposed to just the biases that are applied to the device. These different fabrication flows can lead to different threshold voltages for a storage transistor or a different size for a storage capacitor or resistor. The different threshold voltages for a storage transistor can be set by a time for which a diffusion step is conducted to alter a conductivity state of a channel of the transistor. The different threshold voltages can be associated with different values stored as a conductivity state of the storage element. In specific embodiments of the invention, different storage transistors in a single memory array with different thresholds can occupy the same space in the memory array to keep the memory array uniform and can be different only with regards to the chemical composition of the channel of the storage transistors.

The number of configurable biases applied to the circuit element can vary and the number of potential programmable values of the programmable biases can vary. Likewise, the number of different fabrication flows for the device can vary. The number of configurable biases, the number of potential programmable values thereof, and the number of different fabrication flows will set the number of bits that any multibit memory cell including that circuit element can store. These numbers cannot be placed arbitrarily high and will depend on the characteristics of the storage elements and the sensitivity of the read circuits for the memory. The number of biases applied to the circuit elements will depend on the number of terminals of the circuit elements. The number of potential programmable values of the programmable biases and the different impacts of the different fabrication flows can also be set based on the number of distinguishable conductivity states that the device can be placed into. A memory cell could include a single transistor that is designed to receive a programmable bias on the gate of the device where the combination of biases can place the device in 4 different conductivity states, in which case the memory cell will be able to store 2 bits of information. Alternatively, a memory cell could include a single transistor that is designed to receive two different programmable biases on the gate and drain of the device. In these embodiments, the device could store $\log_2(N^2)$ bits of information where N is the number of biases that can be individually applied to the two terminals. Alternatively, the same memory cell could be fabricated using one of 4 different fabrication flows (e.g., four fabrication flows that each differ by 100s of millivolts of threshold voltage). In these embodiments the device could store $4 \log_2(N^2)$ bits of information. As seen, the number of potential states increase rapidly with the number of fabrication flows, the number of biases, and the number of terminals that can programmatically receive those biases.

In specific embodiments where a device has more than one terminal that defines the conductivity state of the device, the different terminals can be configured to receive the same set of biases or a different set of biases. Whether or not the sets overlap and whether certain combinations of the sets place the device in a distinctive conductivity state will depend on the characteristics of the device. Benefits accrue to approaches in which the sets of biases that can be applied to multiple terminals on a device overlap or are identical because this can minimize the number of bias circuits required to generate the bias signals.

The supply voltages or supply currents that are applied to set the conductivity state of the storage elements can be generated in various ways. For example, a set of supply voltages could be generated from a single supply voltage using a set of voltage regulators such as low drop out voltage regulators. The supply voltages could be generated by other digital, analog, or hybrid voltage regulators such as linear voltage regulators and switching voltage regulators. The supply voltages could also be provided by a resistor divider between the supply voltage and reference voltage with different tap points for voltages that are proportional to the supply voltage. The tap points could be buffered to provide the set of supply voltages. As another example, a set of bias currents could be generated from a single bias current using programmable current mirrors comprising an array of FETs that are commonly biased with a set of cascode connected transistors that are supplying the single bias current.

In specific embodiments of the invention, the read circuits could be biased using the same circuits as the memory cells. For example, a reference voltage applied to a comparator could be the same as a reference voltage applied to the memory cells when the memory cell is in a given conductivity state. These approaches can exhibit certain benefits as variations in the bias circuits used to place the storage elements in a given conductivity state can be counteracted when measuring those conductivity states using the same bias circuits. For example, if a reference voltage for a storage element is lower than it was designed to be, the corresponding read circuit can have a threshold voltage for a comparator decreased accordingly such that the same original desired value associated with the conductivity state is read by the read circuit despite the variation in the conductivity state.

In specific embodiments of the invention, the ROM can be a low power device. The ROM can be designed such that it only consumes an appreciable amount of power when it is read, and further still such that it only consumes an appreciable amount of power when it is read and has been programmed to a specific state. For example, the program nodes of the storage elements can be selected such that they can be biased without having any current flow through the circuit element. As such, the circuit element can store its value and be ready to read without consuming any power. In specific embodiments of the invention, the bias signals can be generated using low power circuits. In specific embodiments of the invention, a set of bias voltages can be generated by a set of low drop-out voltage regulators.

Using the approaches disclosed herein, ROMs with a high level of integration and a high level of information density can be provided. In specific embodiments, the storage elements and read circuits for the ROMs can comprise the same transistors used for the high-speed logic of the computing elements that the ROM will serve as memory for. In specific embodiments, the ROMs disclosed herein can be integrated with a processor with at least one processing core comprising computational units. The computational units can be arithmetic logic units, floating point units, specialized matrix multiplication units, or other custom logic or computational units. The computational units can include logic transistors that are connected to form logic gates. The logic transistors can be FET transistors designed for rapid and efficient processing. The logic transistors can be fin-FETs, gate-all-around transistors, nanowire transistors, quantum tunnel FETs, carbon nanotube transistors, graphene and other two-dimensional material transistors, electron spin transistors, or other transistor technologies. The processor can conduct computations using a set of logic transistors where the logic transistors are any of the types of transistors mentioned above. The storage elements disclosed herein can be logic transistors disclosed herein. In specific embodiments, the combined system comprising the computational units and ROM can be a specialized system for conducting high performance computations such as machine learning or machine intelligence applications, cryptography, or other complex computations. In these embodiments, the ROM can provide hundreds of gigabytes of storage to store things such as the weights for a neural network that the specialized system is implementing. For example, the specialized system can be a neural network accelerator which generates inferences based on stored weights that represent the neural network. In some machine intelligence applications, training is very expensive such that once a neural network is trained, the weights are deployed and are stable for a long time. As such, the weights of the neural network can be programmed into the ROM of a device that is designed specifically to generate inferences for that neural network in response to inputs. In specific embodiments, the underlying device can be a generalized inference generation accelerator which can then be configured to accelerate inference generation for a particular neural network by storing the neural network in ROM for specific versions of the device. For example, the weights for a first neural network could be stored in one set of high-level masks to implement the weights in mask ROM, and the weights for a second neural network could be stored in a second set of high-level masks to implement those different weights in mask ROM while the underlying device below those high-level masks was still the same accelerator. The resulting two different versions of the device would be optimized to generate inferences for two different neural networks while the core underlying computational engine of the device remained the same.

FIG. 1 illustrates FET ROM cell 100 in which node 101 (a source or drain node) of FET ROM cell 100 is either connected to supply voltage 102 ($V_{DD}$) or refence voltage 105. FET ROM cell 100 is read by monitoring the current on bit line 103 when a control signal is sent to word line 104.

Figure 2:
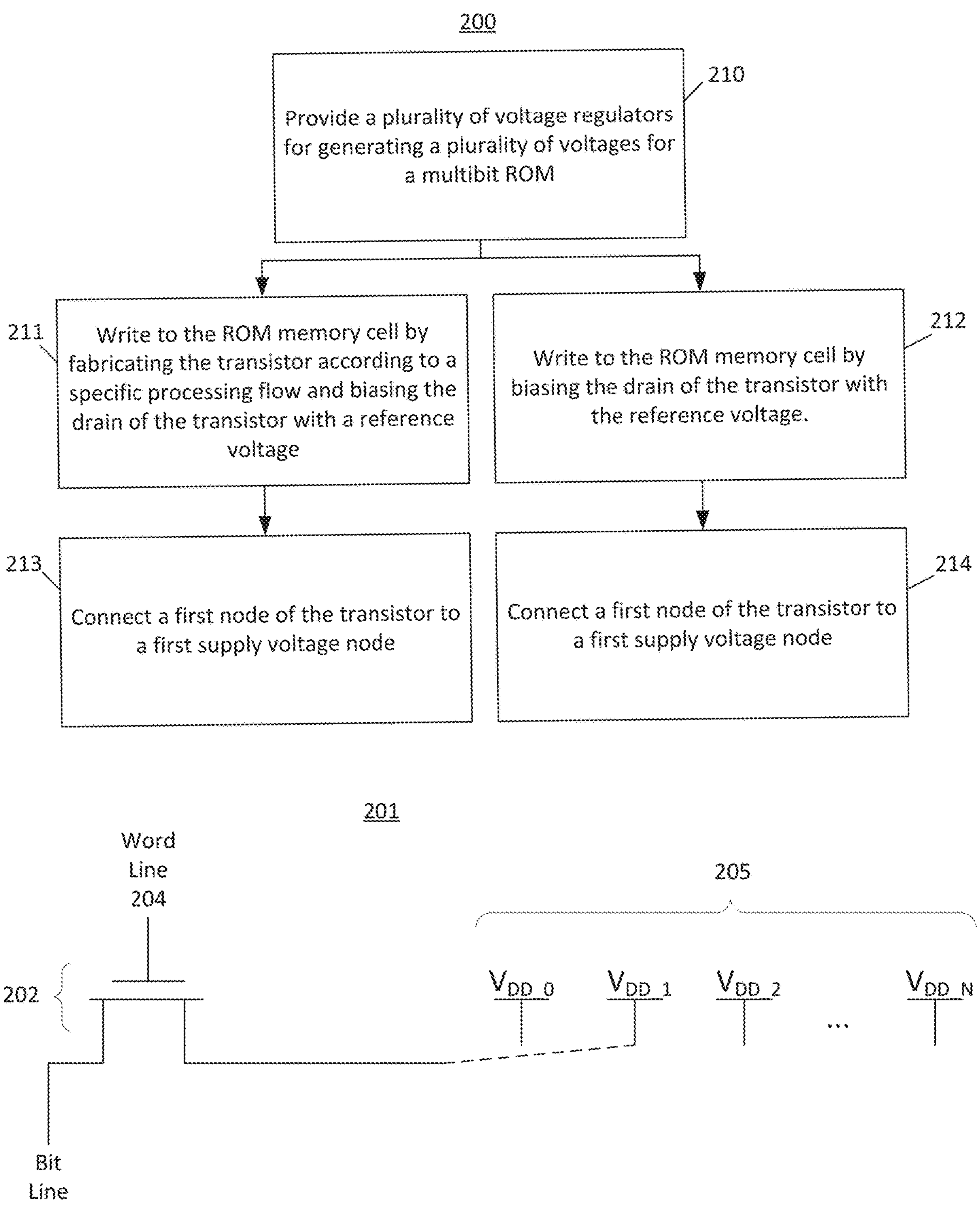
FIG. 2 illustrates a programmed multibit ROM cell which stores a value in the form of a connectivity state or a conductivity state of a transistor in accordance with specific embodiments of the inventions disclosed herein.
Figure 4:
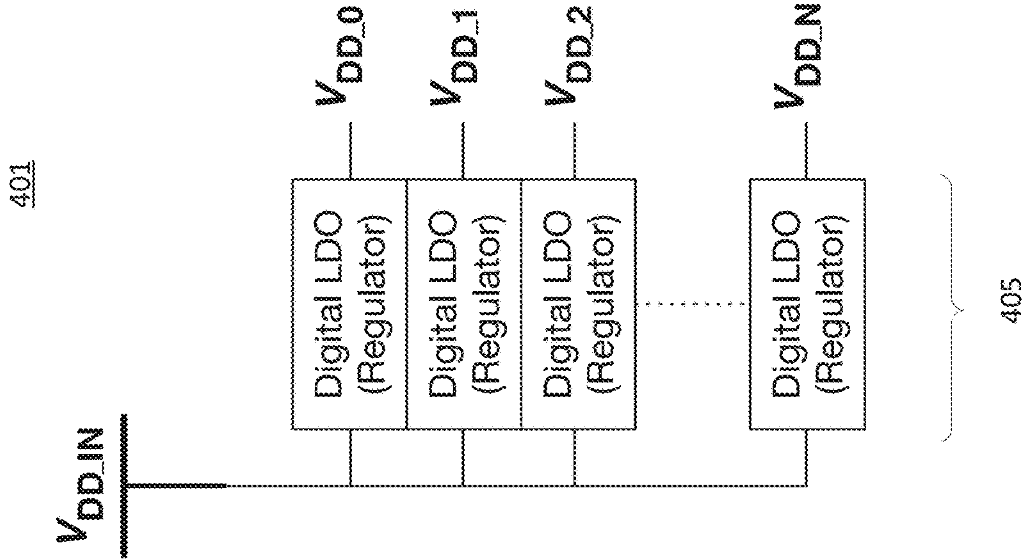
FIG. 4 illustrates a set of voltage regulators for generating a set of voltages in accordance with specific embodiments of the inventions disclosed herein.

FIG. 2 illustrates method 200 and circuit 201 for storing a multibit value as a connectivity state or conductivity state in transistor 202. In specific embodiments, transistor 202 may be a different circuit element that can store a multibit value as a connectivity state or a conductivity state as described herein, may be a FET, or may be a type of transistor other than an FET. Transistor 202 may be a read transistor allowing a read circuit to read the connectivity state of a memory cell or a combined read and storage transistor with a programmed conductivity state allowing a read circuit to read a conductivity state of the memory cell. Circuit 201 includes bit line 203, word line 204, and voltage regulators 205. The method comprises, at 210, providing a plurality of voltage regulators 205 for generating a plurality of voltages for a multibit ROM. Voltage regulators 205 can be the digital low drop out regulators shown in FIG. 4 which generate N+1 supply voltages from a single supply voltage $V_{DD\_IN}$. These N supply voltages can be routed to the terminals of the storage elements (e.g., transistor 202) in the multibit ROM. The voltages can be selected such that they span from above the threshold voltage of the transistor to the supply voltage $V_{DD\_IN}$ of FIG. 4. The spacing between the supply voltages can be linear. The spacing between the supply voltages can also be adjusted by a neural network that is designed to minimize noise in the reading of the voltages from a ROM array of which the illustrated ROM cell (e.g., circuit 201) is a part. In other words, the neural networks described with reference to FIG. 9 may be able to adjust these supply voltages to minimize the loss function used to train the neural networks. As illustrated, the set of voltage regulators 205 (e.g., nodes) in FIG. 2 and the set of voltage regulators 405 (e.g., nodes) in FIG. 4 are labeled using the same labels $V_{DD\_0}$ through $V_{DD\_N}$.

Method 200 for storing a multibit value as a conductivity state in transistor 202 can continue, at 211, with a step of writing to the ROM memory cell by fabricating transistor 202 according to a specific processing flow (e.g., to select a processing flow that produces a device with a specific threshold voltage from among a set of threshold voltages), and biasing the drain of transistor 202 with a reference voltage (e.g., from the plurality of voltage regulators 205). The selection of the processing flow and the reference voltage will determine the conductivity state of transistor 202 and the associated value stored by the ROM. Writing to the ROM memory cell can comprise selecting a voltage from the plurality of bias voltages to connect to the drain of transistor 202.

Method 200 for storing a multibit value as a connectivity state in a circuit element where the circuit element is transistor 202 can continue from 210 (providing a plurality of reference voltages) with 212, a step of writing to the ROM memory cell by biasing the drain of transistor 202 with the reference voltage (e.g., from the plurality of voltage regulators 205). Writing to the ROM memory cell can comprise selecting a voltage from the plurality of bias voltages to connect to the drain of transistor 202.

The method for storing a multibit value as a connectivity state in a circuit element can continue with 214, a step of connecting a first node of transistor 202 to a first supply voltage node. The first supply voltage node can be biased by one of the voltages in the plurality of voltages (e.g., from the plurality of voltage regulators 205). The first node of transistor 202 may be the drain of transistor 202 and the first supply voltage node may be the node that is biased by $V_{DD\_1}$ in the figure. The connection can be a programmatic connection which connects the drain of transistor 202 to the node biased by $V_{DD\_1}$ instead of the N−1 other nodes that are illustrated in the figure. The aforementioned steps (e.g., 214), in which the terminal of the transistor is programmatically connected to a voltage, result in a value of the multibit ROM cell being stored as a connectivity state of transistor 202.

Method 200 for storing a multibit value as a conductivity state in a circuit element, such as transistor 202, can continue at 213 (e.g., from 211) with a step of connecting a first node of transistor 202 to a first supply voltage node. The first supply voltage node can be biased by one of the voltages in the plurality of voltages (e.g., from the plurality of voltage regulators 205). The first node may be the drain of transistor 202 and the first supply voltage node may be the node that is biased by $V_{DD\_1}$ in the figure. The connection can be a programmatic connection which connects the drain of transistor 202 to the biased by $V_{DD\_1}$ instead of the N other nodes that are illustrated in the figure. The aforementioned steps (e.g., 213), in which the terminal of transistor 202 is programmatically connected to a voltage and transistor 202 has a specific threshold voltage as determined by the selected processing flow, result in a value of the multibit ROM cell being stored as a conductivity state of transistor 202 (transistor 202 being in a multibit ROM cell of the multibit ROM array).

Circuit 201 may be part of a ROM cell. A read operation (to transistor 202) can involve applying a high voltage to the control node of the transistor. The high voltage can be referred to as a read voltage. The control node can be the gate of a transistor. The gate can be coupled to word line 204 of the memory, and word line 204 may be connected to the gates of transistors in many other memory cells. Individual memory cells in a ROM array can be read by applying the signal for a word line (e.g., word line 204) and a bit line (e.g., bit line 203) in combination to address a specific cell. The address can be applied to a decoder which generates the appropriate bit line and word line signals to read the status of a given storage element. For example, the connectivity state of transistor 202 can be read by measuring a voltage on bit line 203.

In specific embodiments of the inventions disclosed herein, by using a plurality of biases, a single circuit element such as transistor 202 can store multiple bits in place of a similar circuit element which would otherwise have stored a single bit of information in a traditional ROM cell. ROM arrays in accordance with these embodiments can exhibit much higher information densities as compared to traditional ROM arrays. Integrated ROM storage could be provided on an integrated circuit in close proximity to the computational elements of the integrated circuit.

Figure 3:
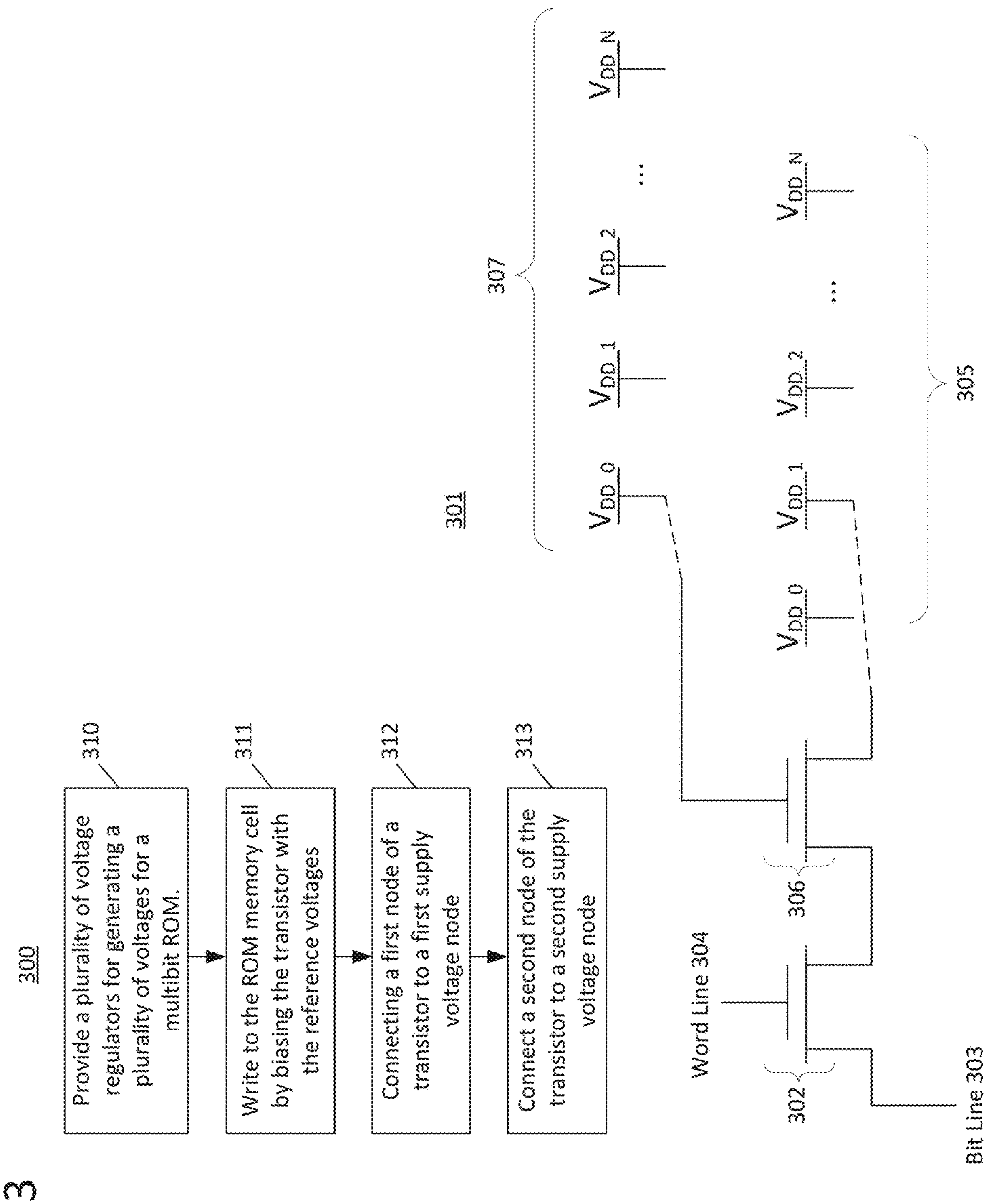
FIG. 3 illustrates a programmed multibit ROM cell which stores a value in the form of a conductivity state of a transistor in accordance with specific embodiments of the inventions disclosed herein.

FIG. 3 illustrates method 300 and circuit 301 for storing a multibit value as a conductivity state in a circuit element such as transistor 306. Circuit 301 may include bit line 303, word line 304, transistor 302, transistor 306, voltage regulators 305, and voltage regulators 307. Transistor 302 may be a read transistor and transistor 306 may be a storage transistor. Transistor 302, transistor 306, or both may be FETs. Method 300, at 310, comprises providing a plurality of voltage regulators 305 and 307 for generating a plurality of voltages for a multibit ROM. Voltage regulators 305 and 307 can be the digital low drop out regulators shown in FIG. 4 which generate N+1 supply voltages from a single supply voltage $V_{DD\_IN}$. These N supply voltages can be routed to the terminals of the storage elements (e.g., transistor 306) in the multibit ROM. The voltages can be selected such that they span from above the threshold voltage of transistor 306 to the supply voltage $V_{DD\_IN}$ (of FIG. 4). The spacing between the supply voltages can be linear or it can be selected to have even linear spacing between the potential conductivity states of transistor 306. The spacing between the supply voltages can also be adjusted by a neural network that is designed to minimize noise in the reading of the voltages from a ROM array of which the illustrated ROM cell (e.g., circuit 301) is a part. In other words, the neural networks described with reference to FIG. 9 may be able to adjust these supply voltages to minimize the loss function used to train the neural networks. As illustrated in FIG. 3, the two sets of voltage regulators 305 and 307 (e.g., nodes) are labeled using the same labels $V_{DD\_0}$ through $V_{DD\_N}$. In specific embodiments, voltage regulators 305 and voltage regulators 307 may be the same voltage regulators. In specific embodiments, voltage regulators 305 and voltage regulators 307 may be distinct voltage regulators. As such, in specific embodiments all of the voltages can be independently adjusted to improve the performance of the memory.

Method 300 for storing a multibit value as a conductivity state in transistor 306 (or another circuit element) can continue, at 311, with a step of writing to the ROM memory cell by biasing transistor 306 with the reference voltages. Writing to the ROM memory cell can comprise selecting a voltage from the plurality of bias voltages (e.g., associated with voltage regulators 305) to connect to the drain of transistor 306 and selecting a voltage from the plurality of bias voltages (e.g., associated with voltage regulators 307) to connect to the gate of transistor 306. The reference voltages (e.g., via voltage regulators 305 and 307) available to select for the two terminals can be the same reference voltages or a different set. The combination of voltages available to select for the two terminals of transistor 306 can be equal to the total number of voltages available for each terminal multiplied together. However, in specific implementations, not all combinations may be distinguishable. For example, if $V_{DD\_0}$ (e.g., corresponding to voltage regulators 307) is lower than the threshold voltage of transistor 306, then a value of $V_{DD\_0}$ applied to the gate will result in the different voltage values (e.g., corresponding to voltage regulators 305) for the drain of transistor 306 to be indistinguishable because transistor 306 is off and has a fixed conductivity state regardless of the current at the drain.

Method 300 for storing a multibit value as a conductivity state in a circuit element such as transistor 306 can continue at 312 with a step of connecting a first node (e.g., drain) of transistor 306 to a first supply voltage node (e.g., of voltage regulators 305). The first supply voltage node can be biased by one of the voltages, such as $V_{DD\_1}$ (as shown in the figure), in the plurality of voltages corresponding to voltage regulators 305. The connection can be a programmatic connection which connects the drain of transistor 306 to the $V_{DD\_1}$ node instead of the N−1 other nodes that are illustrated in the figure.

Method 300 for storing a multibit value as a conductivity state in a circuit element can continue at 313 with a step of connecting a second node (e.g., gate) of transistor 306 to a second supply voltage node (e.g., of voltage regulators 307). The second supply voltage node can be biased by one of the voltages, such as $V_{DD\_0}$ (as shown in the figure), in the plurality of voltages. The connection can be a programmatic connection which connects the gate of transistor 306 to the $V_{DD\_0}$ node instead of the N−1 other nodes that are illustrated in the figure. Although in the illustrated case, the second node can be biased by the same set of voltages, in specific embodiments, the second node can be biased by a different set of voltages which may overlap with or be mutually exclusive to the set of voltages used to bias the first node. For example, in specific embodiments, $V_{DD\_0}$ of voltage regulators 305 and $V_{DD\_0}$ of voltage regulators 307 may refer to different voltages. In specific embodiments, $V_{DD\_0}$ of voltage regulators 305 and $V_{DD\_0}$ of voltage regulators 307 may refer to the same voltage.

The aforementioned steps (e.g., 312 and 313), in which the two terminals (e.g., drain and gate) of transistor 306 are programmatically connected to different voltages (e.g., $V_{DD\_1}$ and $V_{DD\_0}$), result in a value of the multibit ROM cell being stored as a conductivity state of transistor 306.

The terminals of transistor 306 (or other storage device) can be connected to different biases in various ways. For example, transistor 306 can be built with branching nodes from its terminals with connections to different bias nodes. These branches can have fuse or anti-fuse elements which allows the device to be connected via one of the branches nodes to a single bias node by rupturing all but one fuse among a set of fuses, or by fusing a single antifuse among a set of antifuses. The branches can also have gaps that can be filled in by a jump that is added when the device is programmed. The jump could be a mask ROM jump and include two vias and a higher level of metal that can be supplied to cross the gaps. The branches can also have gaps that can be selectively filled in by altering the mask for a layer of wiring in which the branches appear. As another example, the device can be built using a compiler that is programmed to produce the optimal wiring pattern for a set of ROM cells to be interconnected with a set of bias voltages. The connecting steps can comprise connecting one of a set of wires extending from the first node to the first supply voltage node and connecting one of a set of wires extending from the second node to the second supply voltage node.

Circuit 301 may be part of a ROM cell. A read operation (to read the value stored by transistor 306) can involve applying a high voltage to word line 304 and measuring the resulting current on bit line 303. Individual memory cells in a ROM array can be read by applying the signal for a word line (e.g., word line 304) and a bit line (e.g., bit line 303) in combination to address a specific cell. The address can be applied to a decoder which generates the appropriate bit line and word line signals to read the status of a given storage element. The conductivity state of the storage transistor (e.g., transistor 306) can thereby be read by measuring a current on the bit line. The source or drain of the storage transistor that is coupled to the read transistor can be biased to a low voltage during a read operation with just enough headroom for the input to a comparator. Transistor 302 can be referred to as a read transistor because it controls the read operation for the ROM cell.

In specific embodiments of the inventions disclosed herein, by using a plurality of biases, a single circuit element, such as transistor 306, can store multiple bits in place of a similar circuit element which would otherwise have stored a single bit of information in a traditional ROM cell. ROM arrays in accordance with these embodiments can exhibit much higher information densities as compared to traditional ROM arrays. Integrated ROM storage could be provided on an integrated circuit in close proximity to the computational elements of the integrated circuit.

FIG. 4 illustrates an example of circuit 401 with a plurality of voltage generators (for generating a plurality of voltages) and a plurality of voltage regulators 405 as part of a multibit ROM. Circuit 401 may include a supply voltage $V_{DD\_IN}$ and voltages $V_{DD\_0}$ through $V_{DD\_N}$, each voltage being coupled with voltage regulators 405. Voltage regulators 405 may each include a digital low-dropout (LDO) regulator. Circuit 401 may be combined with, incorporated by, or overlap features with circuit 201 and/or circuit 301. For example, voltage regulators 405 may correspond to voltage regulators 205, voltage regulators 305, and voltage regulators 307. The multibit ROM may include one or more circuits 401, one or more circuits 201, one or more circuits 301, or a combination thereof.

The multibit ROM that includes circuit 401 can also comprise a transistor having a first node and a second node, such as transistor 202 or transistor 306, as well as other features of FIGS. 2 and 3. One or more sets of voltage regulators 405 may be coupled with (or not coupled with) the transistor in a variety of ways. Voltage regulators 405 may be coupled with (programmatically connected) a node or terminal of the transistor during fabrication, packaging, deployment, or back end of line processing. Voltage regulators 405 may be coupled with, or not coupled with, a node or terminal of the transistor via a combination of wires, fuses, antifuses, mask layers, jumps, tap points, etc. A variety of processes may be used to form a connection between a terminal of a storage element and a desired voltage source or to destroy a connection between a terminal of the storage element and an undesired voltage source. Accordingly, biases may be used to set the conductivity state of the storage element as desired.

The first node can be a drain of the transistor or a source of the transistor and the second node can be a gate of the transistor. The multibit ROM can include a connection from the first node to a first supply voltage and a connection from the second node to a word line, as shown in FIG. 2. The multibit ROM can also comprise a connection from the first node to a first supply voltage node and a connection from the second node to a second supply voltage node, as shown in FIG. 3. The first supply voltage node may correspond to a different voltage or the same voltage as the second supply voltage node. As illustrated by the dotted lines (of FIGS. 2 and 3), the one or more nodes of the transistor can be programmatically connected to bias nodes from among N+1 bias nodes each. A value of a multibit ROM cell in the multibit ROM may be stored as a connectivity state of the transistor or as a conductivity state of the transistor. Writing to the ROM memory can involve determining an address of the ROM cells and assigning values to those ROM cells by connecting the terminals of the storage transistor to the bias voltages (e.g., corresponding to voltage regulators 405) associated with that value.

In specific embodiments of the invention, each terminal of a storage element (e.g., transistor) can be associated with a set of wires to enable them to be connected to different bias voltages associated with voltage regulators 405. The multibit ROM cell can also comprise a set of wires extending from the first node or terminal of the storage element. Each wire in the set of wires extending from the first node can be uniquely associated with one voltage in the plurality of voltages that are available to bias the first node. The connection from the first node to the first supply voltage node includes a wire from the set of wires extending from the first node and a programmed connection to the first supply voltage node. The multibit ROM cell can also comprise a set of wires extending from the second node or terminal of the storage device. Each wire in the set of wires extending from the second node can be uniquely associated with one voltage in the plurality of voltages. The connection from the second node to the second supply voltage node includes a wire from the set of wires extending from the second node and a programmed connection to the second supply voltage node.

In specific embodiments of the invention, each terminal of a storage element can have a wire extending from the node where the wire includes a set of tap points. The set of tap points in the wire can each be uniquely configured to be connected to one voltage in a plurality of voltages that can be applied to that terminal of the storage element. The connection between the tap point and a node that is biased with the voltage from among the plurality of voltages that is selected to be applied to the terminal of the storage element can be programmed using antifuse or fuse elements, one or more customized mask layers, jumps, or any circuit element that can be used to connect two nodes of a circuit programmatically during fabrication, packaging, or deployment.

The programmed connection of a storage element to the first and second supply voltages (e.g., voltage regulators 405) can be made by wires formed by one or more masks that are unique to a programmed state of the multibit ROM. The programmed connection can be conducted during fabrication of a wiring layer of an integrated circuit on which the multibit ROM is located. The masks can define a pattern that will connect one wire from the set of wires per terminal to an associated supply voltage. The pattern is unique to the programmed state of the multibit read only memory cell because the pattern defines the connections to the terminals which in turn defines the conductivity state of the ROM cell. The pattern can be formed by one or more masks. A single mask could be used to form the pattern if that pattern were available to be formed on a single wiring level with different masks being unique in terms of which nodes they connect and which they don't. Multiple masks could be used if the pattern involves vias and other metal layers.

The programmable connections that are used to write to a ROM cell in accordance with this disclosure can be made at different times. For example, the connection can be made during fabrication of an integrated circuit on which the ROM cell will be integrated during back end of line processing. As another example, the connection can be made using fuses or anti-fuses such as after chip fabrication but before deployment (e.g., prior to or during a packaging process for the integrated circuit). As another example, the connections can be made electronically during packaging or after a chip has been packaged by applying electrical signals to alter the state of conductive elements in the integrated circuit and form or destroy connections between the terminals of the storage elements and biases used to set the conductivity state of the storage elements.

In specific embodiments of the inventions disclosed herein, by using a plurality of biases, a single circuit element can store multiple bits in place of a similar circuit element which would otherwise have stored a single bit of information in a traditional ROM cell. ROM arrays in accordance with these embodiments can exhibit much higher information densities as compared to traditional ROM arrays. Integrated ROM storage could be provided on an integrated circuit in close proximity to the computational elements of the integrated circuit.

Figure 5:
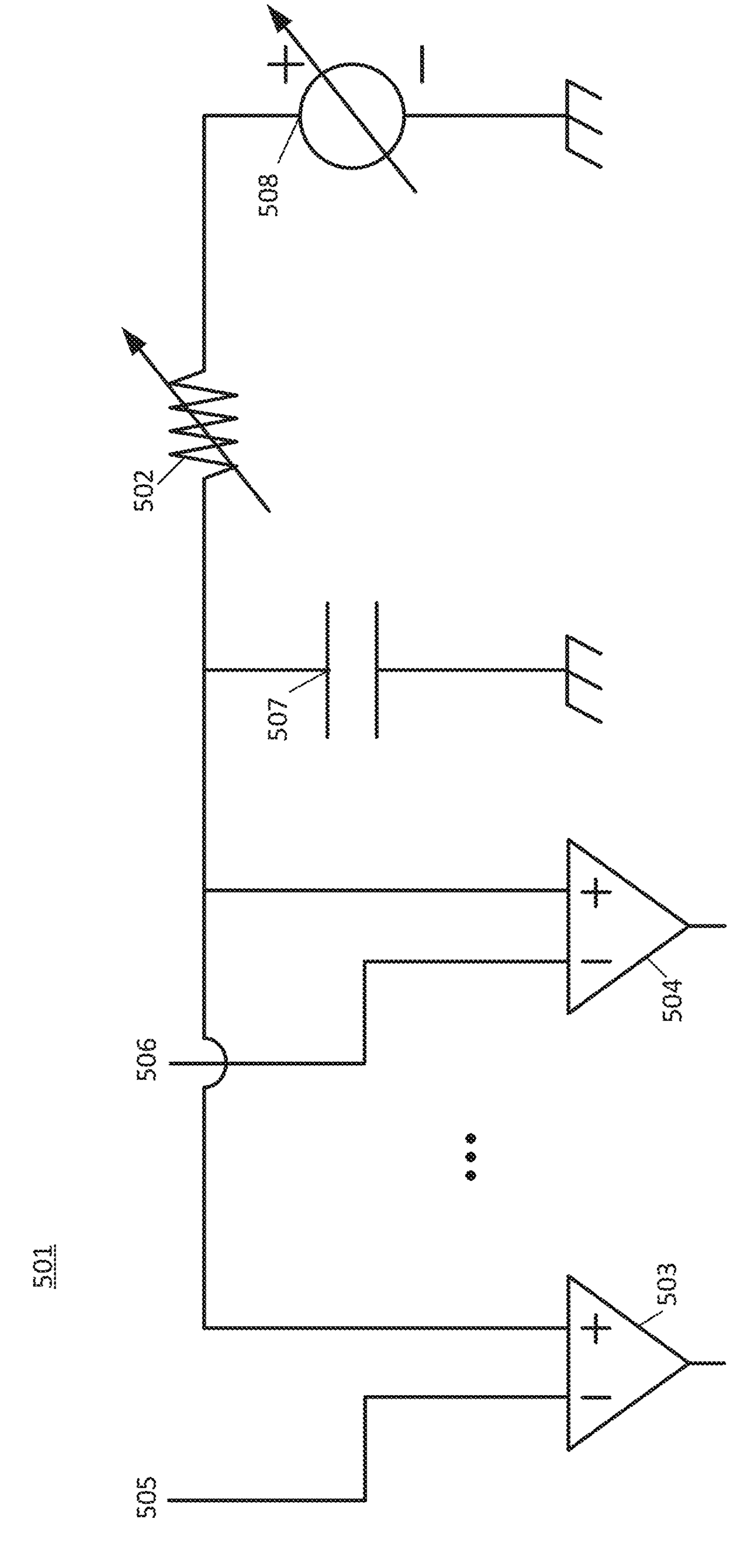
FIG. 5 illustrates the operation of a read circuit for the programmed multibit ROM cell of FIG. 2 above in accordance with specific embodiments of the inventions disclosed herein.

FIG. 5 illustrates circuit 501, which may include features of circuit 201 (in FIG. 2) with the addition of circuitry representing additional features of the bit line and a specific read circuit in the form of multiple comparators (e.g., comparator 503 and comparator 504) coupled to the bit line. Circuit 501 includes transistor 502 (represented by a variable resistor in the figure), comparator 503, comparator 504, read reference voltage 505, read reference voltage 506, bit line capacitance 507, and supply voltage 508. Transistor 502 may be a FET or may be a different storage component, with a transistor only being an example. Different read circuits disclosed herein could be used in place of this read circuit, and the multiple comparator read circuit is only used as an example. Although two comparators (503 and 504) are shown, any number of comparators may be part of circuit 501. Read reference voltage 505 may be associated with comparator 503 and read reference voltage 506 may be associated with comparator 504.

The read circuit is coupled to the source of transistor 502, which stores the state of the memory cell. The read circuit can include a bit line that is shared by numerous other storage elements (e.g., transistors) that do not share the same word line connection as transistor 502. Bit line capacitance 507 is represented by a capacitor. The bit line may have a fixed capacitance. Transistor 502 is shown in circuit 501 as a resistor which represents the "on" resistance of transistor 502. Supply voltage 508 is connected to the drain node of transistor 502 and is shown in circuit 501 as a variable supply. However, the value of supply voltage 508 will be fixed when the connectivity state of the cell has been set to store the value of the memory cell. During a read operation, the voltage that is applied by the read voltage (through transistor 502) will charge up the bit line. The comparator (comparator 503 or comparator 504) with the highest read reference voltage (read reference voltage 505 or read reference voltage 506 respectively) that flips its output during the read operation will indicate the connectivity state of the memory cell. The read operation therefore involves reading which comparator output tripped and taking the reference voltage input to that comparator as the read value. As will be described below, the comparators can be biased using the same voltages as generated by the reference generator circuits in FIG. 4 which produced the bias voltages for setting the connectivity state of the memory cell transistors. Accordingly, any variation in the reference voltages that set the state of the transistors will be offset by corresponding changes in the comparator levels.

In specific embodiments of the inventions disclosed herein, by using a plurality of biases, a single circuit element, such as transistor 502, can store multiple bits in place of a similar circuit element which would otherwise have stored a single bit of information in a traditional ROM cell. ROM arrays in accordance with these embodiments can exhibit much higher information densities as compared to traditional ROM arrays. Integrated ROM storage could be provided on an integrated circuit in close proximity to the computational elements of the integrated circuit.

Figure 6:
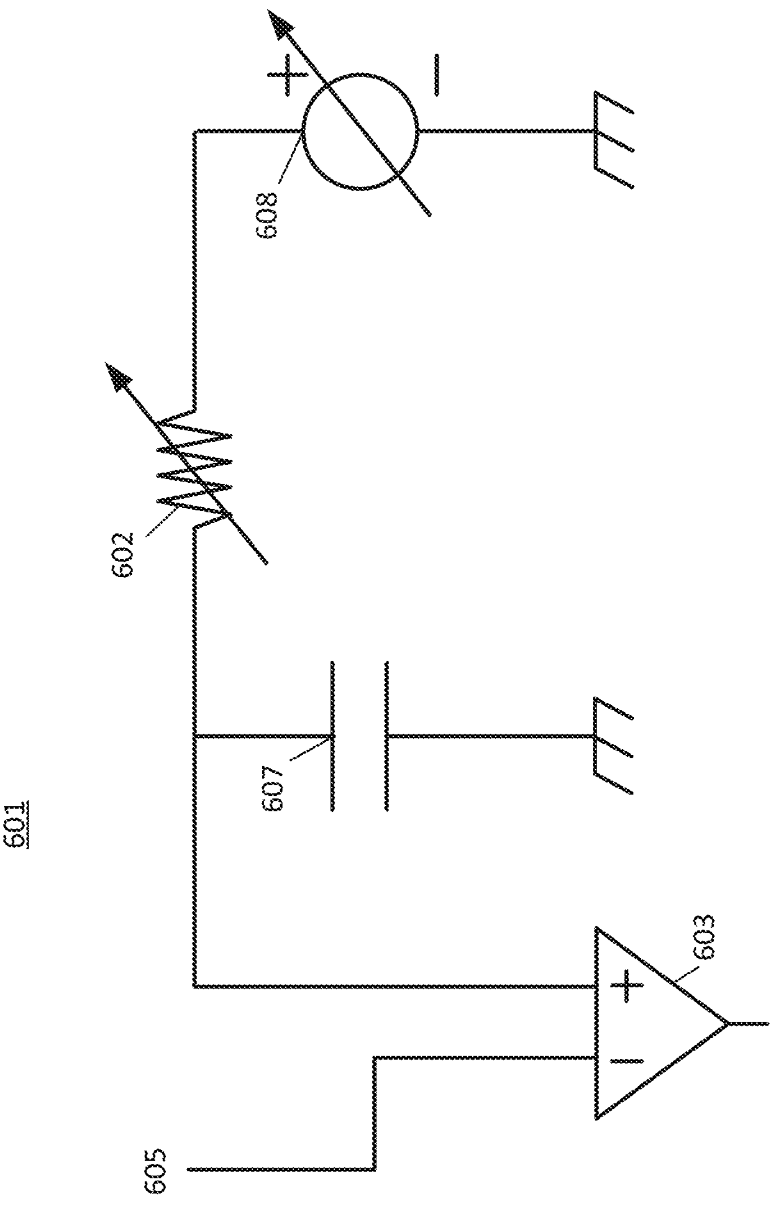
FIG. 6 illustrates the operation of a read circuit for the programmed multibit ROM cell of FIG. 3 above in accordance with specific embodiments of the inventions disclosed herein.

FIG. 6 illustrates circuit 601, which may include features of circuit 301 (in FIG. 3) with the addition of circuitry representing additional features of the bit line and a specific read circuit. Circuit 601 may also incorporate aspects of circuit 201, circuit 401, and circuit 501. Circuit 601 includes transistor 602, comparator 603, read reference voltage 605, capacitor 607, and supply voltage 608. Transistor 602 may be a storage transistor and may be similar to transistor 306. The read circuit is coupled to transistor 602, which stores the state of the memory cell. The read circuit can include a read transistor (e.g., similar to transistor 302) connected between a node of transistor 602 and capacitor 607. The read transistor is not represented independently in FIG. 6 because it is assumed to be biased at such a high relative voltage that it can essentially be ignored. However, in specific implementations, the resistance of the read transistor (the switch) can be estimated, or measured during calibration, and be calibrated out of impacting a measurement of the conductivity state of transistor 602 during a read operation. In specific embodiments, the read transistor can be sized such that it will not have an appreciable resistance compared to transistor 602 (e.g., the storage transistor) such as by having a larger channel width and smaller channel length than transistor 602.

As illustrated in FIG. 6, a first node of transistor 602 is the source or drain node and it is connected to supply voltage 608. A second node of transistor 602 is the gate node and it is connected to another supply voltage (not shown). The read circuit may include a second transistor (not shown) which is connected to a third node of transistor 602 which is either the source or drain node of transistor 602. Transistor 602 is shown in circuit 601 as a resistor with a programmable resistance value. Supply voltage 608 connected to the drain node of transistor 602 is shown in circuit 601 as a variable supply. This voltage will impact the current through the read circuit and so, in specific embodiments, the logic of circuit 601 keeps track of the applied voltage (e.g., supply voltage 608) when sensing the conductivity state of the ROM cell and may also accordingly adjust a measuring threshold voltage for the read circuit as described below.

The read circuits disclosed herein could be configured to be connected to different bit lines in the memory at different times as controlled by a read address for the memory cell being read. A read circuit for a ROM cell in accordance with specific embodiments disclosed herein can also include capacitor 607. Capacitor 607 can be used for a read operation and be referred to as a read capacitor. The read circuit can be shared by multiple ROM cells such that multiple cells share the same capacitor (e.g., capacitor 607). Capacitor 607 can be a discrete element for the read circuit in the form of a plate capacitor integrated with the memory array. Alternatively, capacitor 607 can include or comprise the parasitic capacitance of the bit line. Alternatively, capacitor 607 can include the parasitic capacitance of any circuits, such as the comparator 603, which are attached to the bit line. Capacitor 607, transistor 602, and a read transistor can be coupled such that a current that flows through transistor 602 and the read transistor charges capacitor 607. By measuring the time it takes to charge capacitor 607, an estimate of the resistance of transistor 602 can be obtained. The size of capacitor 607, the transistor 602, and the bias voltages can be selected to assure a sufficient dynamic range for detecting the conductivity state of the storage element (e.g., transistor 602). An expected charge time for the least conductive conductivity state should occur within a reasonable read time for comparable ROM circuits. Reading the multibit ROM cell can involve applying a read signal to a gate of the read transistor mentioned above, charging capacitor 607 using a current that flows through transistor 602 and the read transistor, and sensing a charge time of capacitor 607 as it is charged by the current.

A read circuit for a ROM cell in accordance with specific embodiments disclosed herein can also include a sensing circuit. The sensing circuit can be configured to sense a charge time of capacitor 607 as it is charged by the current. Sensing a charge time of capacitor 607 can comprise supplying a measuring reference voltage to a comparator (e.g., comparator 603). The measuring reference voltage can be generated using the same circuitry used to generate the bias voltages for transistor 602. In these approaches, the measuring reference voltage may adjust automatically with variations in the conductivity state imparted to transistor 602 by the bias voltages. The measuring reference voltage can change from one read operation to another based on the value of the bias voltage applied to the drain of transistor 602. For example, the measuring reference voltage could be set to one half of the drain bias voltage. Using this approach, and the fact that capacitor 607 may charge according to an RC time constant curve, the read times used to detect a given conductivity state will be unaffected by the change in the drain bias voltage.

The sensing circuit can comprise comparator 603 coupled to read reference voltage 605 and to capacitor 607 (e.g., a read capacitor). Comparator 603 can have a negative input coupled to the read reference voltage 605 and a positive input coupled to capacitor 607 (as shown in the figure). Alternatively, comparator 603 can have a positive input coupled to read reference voltage 605 and a negative input coupled to capacitor 607. The output of comparator 603 can be connected to a counter circuit. The counter circuit can be coupled to an output of comparator 603 and a ring oscillator. The read operation can then involve sensing a charge time of capacitor 607 by supplying a measuring reference voltage to comparator 603, running the ring oscillator, counting, using a counter circuit, the oscillations of the ring oscillator while the current is supplied to capacitor 607, and stopping the counter based on an output from comparator 603. Since the output of comparator 603 indicates that capacitor 607 has been charged to the measuring reference voltage, the counter circuit will be forced to stop counting based on that comparator output.

The sensing circuit can alternatively comprise a ring oscillator that is powered by the voltage of the bit line. A counter circuit can then be operated to count the number of oscillations in the ring oscillator to determine how quickly the ring oscillator began oscillating when capacitor 607 was given a fixed amount of time to charge and be read. The read operation can then involve supplying the bit line voltage as power to a ring oscillator and counting the number of oscillations in the ring oscillator using a counter circuit in a fixed read period. A highly conductive state would result in a high count while a low conductive state would result in a low count in that fixed read period.

In specific embodiments of the inventions disclosed herein, by using a plurality of biases, a single circuit element, such as transistor 602, can store multiple bits in place of a similar circuit element which would otherwise have stored a single bit of information in a traditional ROM cell. ROM arrays in accordance with these embodiments can exhibit much higher information densities as compared to traditional ROM arrays. Integrated ROM storage could be provided on an integrated circuit in close proximity to the computational elements of the integrated circuit.

Figure 7:
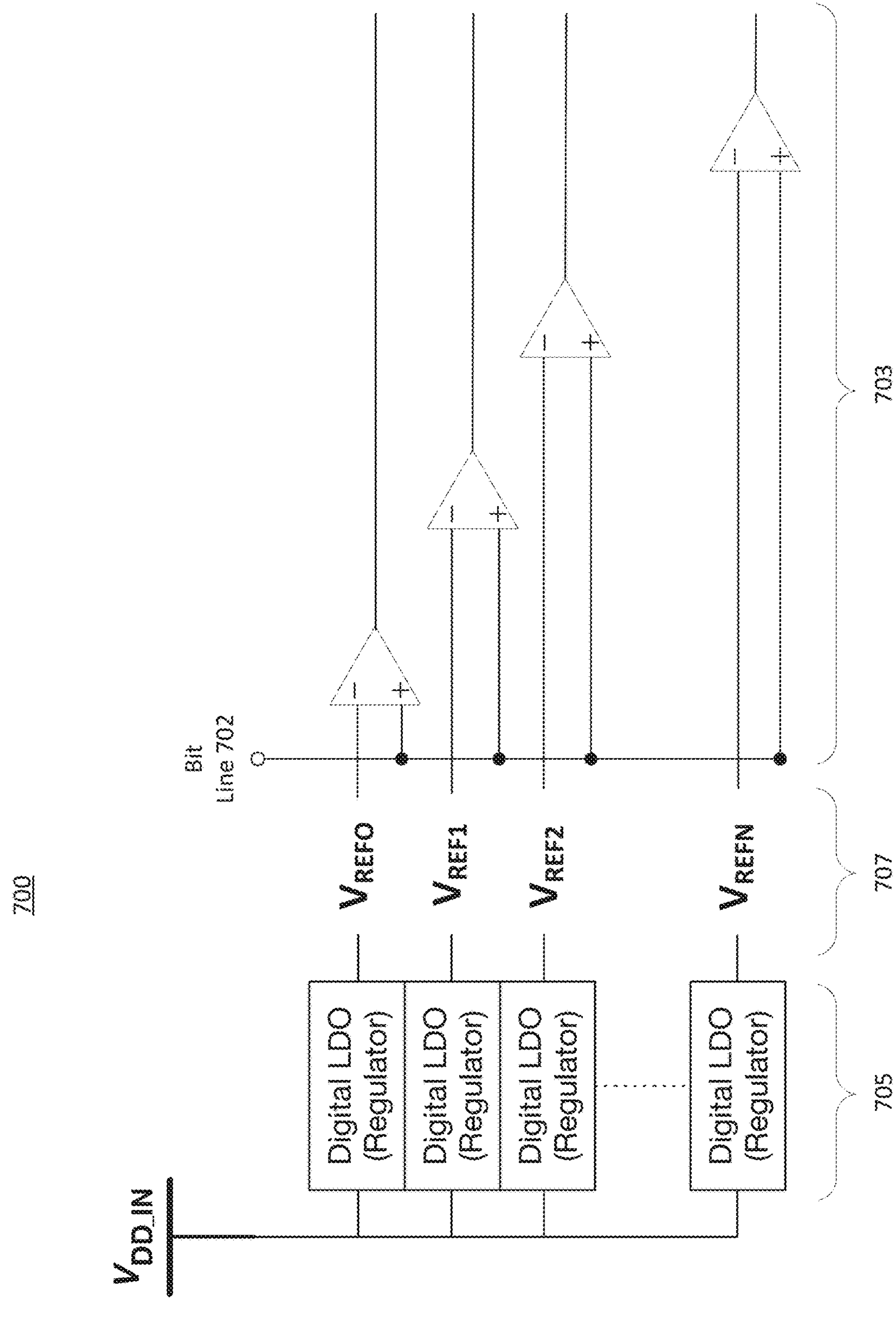
FIG. 7 illustrates a read circuit with a set of voltage regulators and a set of comparators in accordance with specific embodiments of the inventions disclosed herein.

FIG. 7 illustrates read circuit 700 with a set of voltage regulators 705 and a set of comparators 703 in accordance with specific embodiments of the inventions disclosed herein. Voltage regulators 705 can be the same type of regulators from FIG. 4 (voltage regulators 405). Read circuit 700 also includes bit line 702, reference voltage levels 707 (e.g., comparison voltage levels), and $V_{DD\_IN}$.

Voltage regulators 705 provide reference voltage levels 707 to comparators 703 which are labeled $V_{REF}$ in the figure. As shown, comparators 703 and voltage regulators 705 are in a one-to-one correspondence meaning that there is one voltage regulator paired with one comparator in a given read circuit. In specific embodiments, voltage regulators 705 may be paired with different comparators 703 in different read circuits in a given multibit memory system. Reference voltage levels 707 can be approximately equal to the reference voltages provided to the memory cells less one half of the step between adjacent voltages in the set of reference voltages for the memory cells. In other words, each reference voltage level 707 of the set of reference voltage levels 707 can lie approximately halfway between each reference voltage (for the memory cells) of the set of reference voltages. The steps between reference voltage levels 707 or between reference voltages can be uniform or non-uniform. In specific embodiments, the set of voltage regulators that provide voltages to the memory cells can overlap with the set of voltage regulators 705 that provide voltages to comparators 703. In specific embodiments, the set of voltage regulators 705 that provide the voltages to comparators 703 and the set of regulators that provide voltages to the memory cells can be designed such that common offsets in the voltage regulators apply to both sets of regulators equally. For example, the regulators can operate off the same supply voltage and can share specific elements such as supply current transistors, current mirrors, and bias circuits generally.

As illustrated, bit line 702 is connected to the input terminal of a set of comparators 703, and the other input of each of the comparators 703 is connected to a bias voltage (e.g., reference voltage level 707). When read circuit 700 is used with memory cells that are in accordance with FIG. 2, bit line 702 (corresponding to bit line 203) can operate under the principle of charge sharing such that it reaches the voltage applied to the storage element (e.g., transistor 202) in the memory array after a fixed read period. The fixed read period could be set based on the worst case expected charge sharing period which could be set by the lowest bias (e.g., reference voltage level 707) that can be applied to the memory elements. The highest comparator 703 that trips during the read period could be used to determine the value stored in the memory cell (e.g., at transistor 202).

When read circuit 700 is used with memory cells that are in accordance with FIG. 3, the bit line 702 (corresponding to bit line 303) can charge up according to a charging characteristic set by the conductivity of the storage element (e.g., transistor 306) during a fixed read period. The fixed read period could be set based on a desired dynamic range for potential values stored in the memory cells. The highest comparator 703 that trips during the read period could still be used to determine the value stored in the memory cell (e.g., at transistor 306). Alternatively, the speed at which specific comparators (of the set of comparators 703) trip during the read period could be used to determine the value stored in the memory cell. A counter circuit that is designed to switch off and stop counting when a comparator trips could be used to measure that speed.

In specific embodiments of the inventions disclosed herein, by using a plurality of biases, a single circuit element can store multiple bits in place of a similar circuit element which would otherwise have stored a single bit of information in a traditional ROM cell. ROM arrays in accordance with these embodiments can exhibit much higher information densities as compared to traditional ROM arrays. Integrated ROM storage could be provided on an integrated circuit in close proximity to the computational elements of the integrated circuit.

Figure 8:
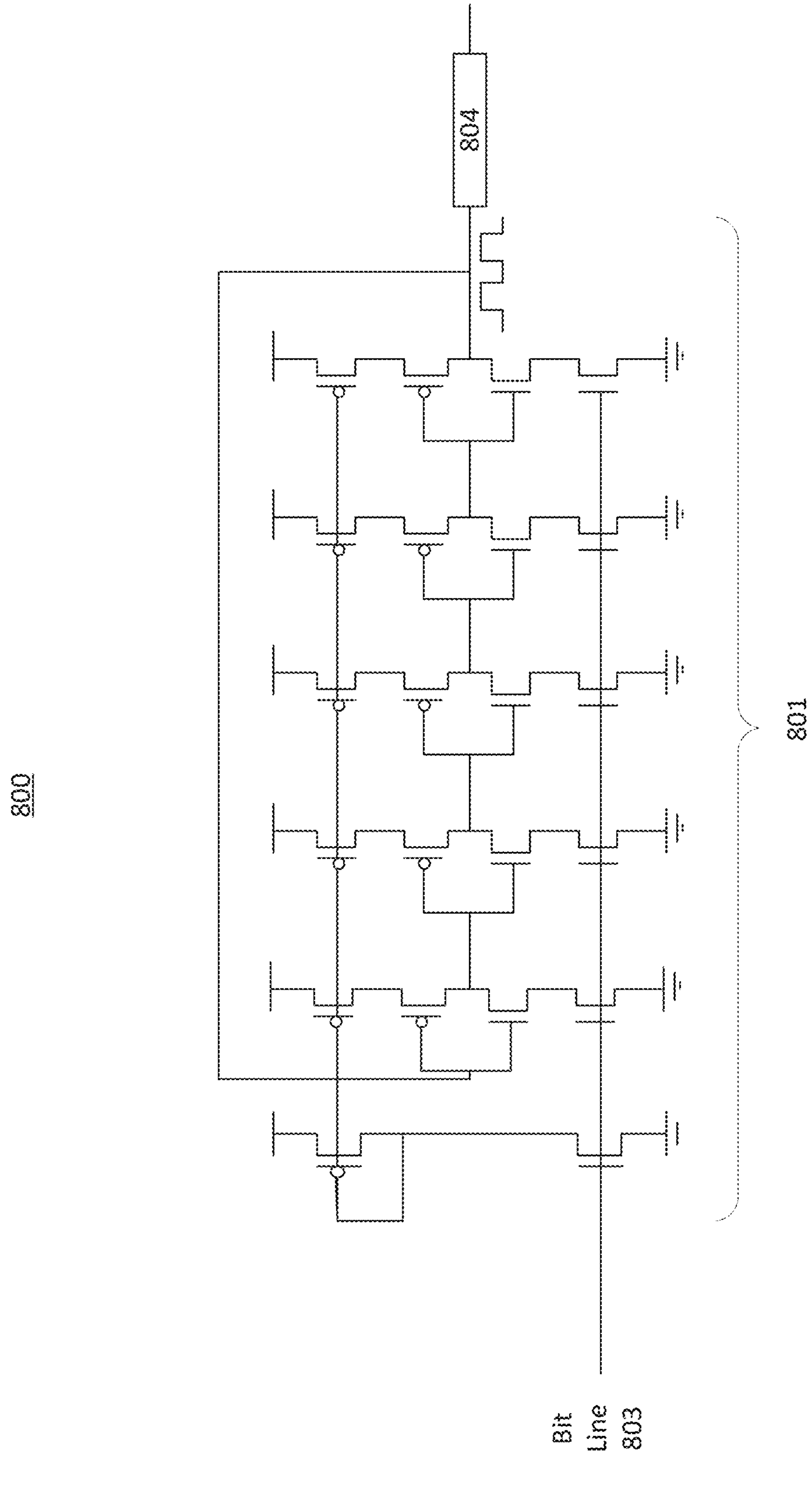
FIG. 8 illustrates a read circuit with a voltage-controlled oscillator (VCO) in accordance with specific embodiments of the inventions disclosed herein.

FIG. 8 illustrates read circuit 800 with voltage-controlled oscillator (VCO) 801 in accordance with specific embodiments of the inventions disclosed herein. As illustrated, bit line 803 is connected to the input terminal of VCO 801. When read circuit 800 is used with memory cells that are in accordance with FIG. 2, bit line 803 (corresponding to bit line 203) can operate under the principle of charge sharing such that it reaches the voltage applied to the storage element (e.g., a transistor such as transistor 202) in the memory array after a fixed read period. The fixed read period could be set based on the worst case expected charge sharing period which could be set by the lowest bias that can be applied to the memory elements. The frequency output on the output of VCO 801 at the end of the fixed read period could be used to determine the value stored in the memory cell. The frequency could be determined by measuring a distance between the pulses at the end of the read period.

When read circuit 800 is used with memory cells that are in accordance with FIG. 3, bit line 803 (corresponding to bit line 303) can charge up according to a charging characteristic set by the conductivity of the storage element (e.g., a transistor such as transistor 306) during fixed read period. The fixed read period could be set based on a desired dynamic range for potential values stored in the memory cells. The number of pules generated by VCO 801 during the fixed period, as determined by counter circuit 804, which may be designed to turn off at the end of the fixed period, could be used to determine the value stored in the memory cell. Alternatively, the speed at which specific comparators trip during the read period could be used to determine the value stored in the memory cell. Counter circuit 804, which may be designed to switch off and stop counting when a comparator trips, could be used to measure that speed.

In specific embodiments of the inventions disclosed herein, by using a plurality of biases, a single circuit element can store multiple bits in place of a similar circuit element which would otherwise have stored a single bit of information in a traditional ROM cell. ROM arrays in accordance with these embodiments can exhibit much higher information densities as compared to traditional ROM arrays. Integrated ROM storage could be provided on an integrated circuit in close proximity to the computational elements of the integrated circuit.

Figure 9:
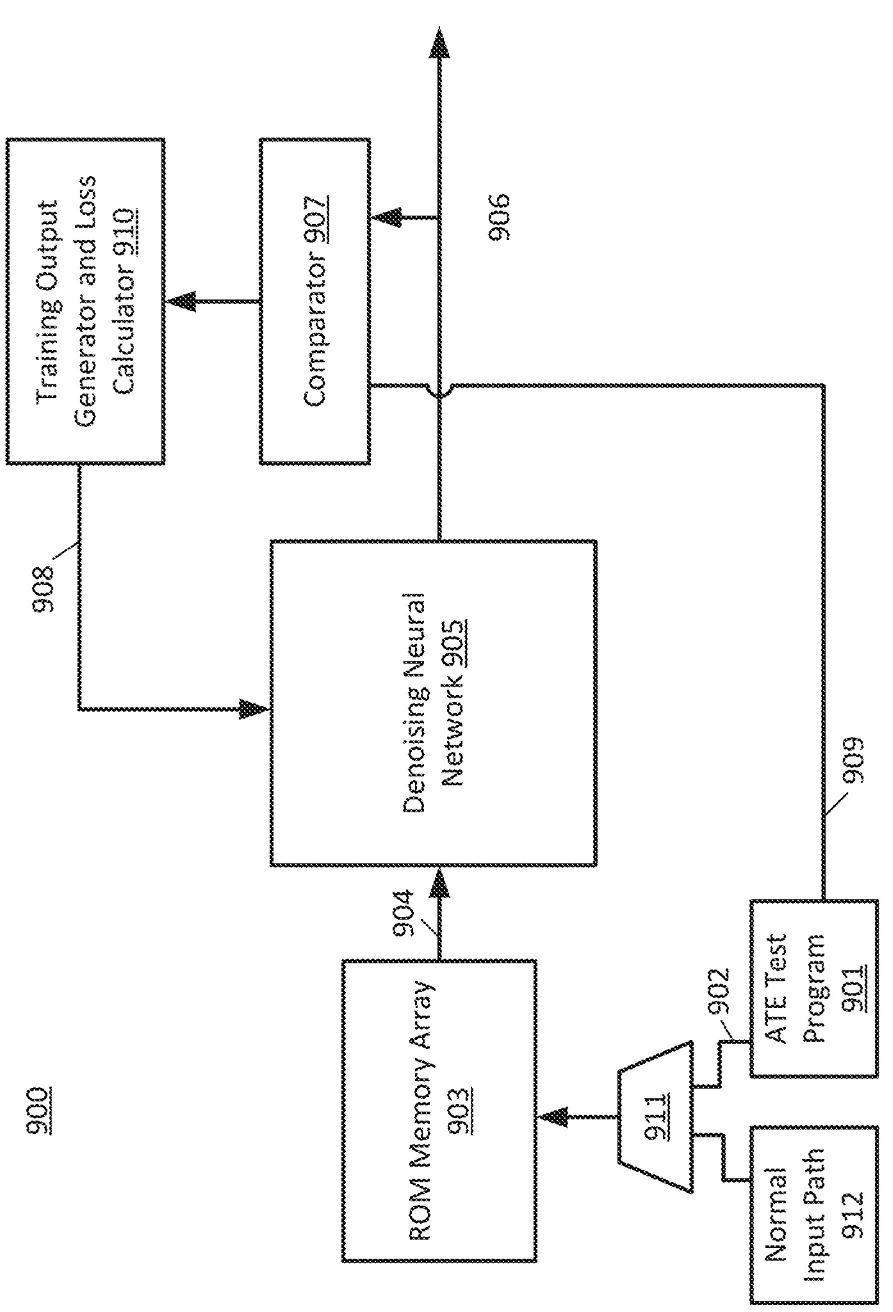
FIG. 9 illustrates a read circuit for a ROM memory array that has been augmented with a neural network decoder in accordance with specific embodiments of the inventions disclosed herein.

FIG. 9 illustrates read circuit 900 for ROM memory array 903 that has been augmented with a neural network decoder in accordance with specific embodiments of the inventions disclosed herein. In specific embodiments, the decoder neural network has been trained on ROM memory array 903 to filter out noise from ROM memory array 903. ROM memory array 903 (e.g., a ROM cell array) can be in accordance with the examples described above. As can be seen in the figure, the decoder neural network (e.g., denoising neural network 905) can modify noisy outputs 904 (e.g., noisy output values) into denoised outputs 906. The illustrated approach also shows how the neural network can be trained. For example, automated test environment (ATE) test program 901 may supply golden values (e.g., ground truth gold values) as test inputs 902 to be stored by ROM memory array 903, and then comparing the read values (e.g., denoised output 906) corresponding to those stored golden values against golden values 909 via comparator 907. The difference between the two can be used in the loss function for training the neural network to denoise the noisy outputs 904, via training output generator and loss calculator 910. Test inputs 902 may be tester generated reads for training. ATE test program 901 may generate test inputs 902 for the ROM memory array 903 and may generate golden values 909 in order to train the neural network.

The neural network can learn the error sources of ROM memory array 903, which allows for increasing the density of the ROM cells by storing multiple bits per cell with less concern over the impact of noise on those cells. The noise source can be attributable to the variant routing distances, storage transistor idiosyncrasies, differences in the conductivity of the configurable connections (e.g., fuses) between the storage transistor and bias sources, read circuit variances, and others. Notably, approaches such as those in FIG. 2 exhibit certain benefits in that the state of the transistor (e.g., transistor 202) can be read definitively using a charge sharing circuit such that the idiosyncrasies of the individual storage transistors do not need to be learned by the neural network. In specific embodiments, the loss function and feedback loop of the training program for the neural network can also be able to adjust any bias voltages used to store the values in ROM memory array 903.

The illustrated approach can work well with ROM arrays that store values using analog conductivity states such as the those mentioned herein (e.g., a bias voltage connected to a source of a single transistor cell or the source-to-drain conductivity of a FET with a given gate and drain bias voltage). The encoder neural network and the decoder neural network can be hardware implemented and integrated with the ROM array (e.g., ROM memory array 903). In specific embodiments, any ROM data for the decoder neural network, and optional encoder neural network, can be implemented using standard single value ROM to avoid the impact of noise on the circuits that are designed to filter out the noise on the multibit ROM array. The combined system can include multiplexer 911 to feed in test inputs 902 (training inputs) from ATE test program 901 (training data input generator) for the training phase of the neural network.

As shown, the system can also include a training output generator and loss calculator 910 with knowledge of test inputs 902 (e.g., golden values 909) provided by ATE test program 901 (e.g., the training data input generator). The figure also shows how loss 908 can be fed back to the decoder neural network (e.g., denoising neural network 905) during training. Gradients from the training output generator and loss calculator 910 may also be fed back to the decoder neural network (e.g., denoising neural network 905) during training. Once trained, the weights of the decoder neural network can be set for permanent use using ROM or any form of nonvolatile memory. Alternatively, the decoder neural network can be periodically retrained in phases between operational use of ROM memory array 903. Multiplexer 911 may switch inputs from ATE test program 901 to normal input path 912. For example, multiplexer 911 may switch to normal input path 912 once the system is trained or between phases of training. Normal input path 912 may input data used during normal operation of ROM memory array 903 (e.g., not during the training of the neural network).

Integration of ROM memory array 903 with processing circuitry can be assisted in these embodiments because the noise cancelling effect of the neural network will enable the bit, word, and supply lines of ROM memory array 903 to be less uniform that in standard ROM circuits and multibit memory circuits which would enable the layout of ROM memory array 903 to be more conformal to the required layout of the processing circuitry.

In specific embodiments of the inventions disclosed herein, by using a plurality of biases, a single circuit element can store multiple bits in place of a similar circuit element which would otherwise have stored a single bit of information in a traditional ROM cell. ROM arrays (e.g., ROM memory array 903) in accordance with these embodiments can exhibit much higher information densities as compared to traditional ROM arrays. Integrated ROM storage could be provided on an integrated circuit in close proximity to the computational elements of the integrated circuit.

Figure 10:
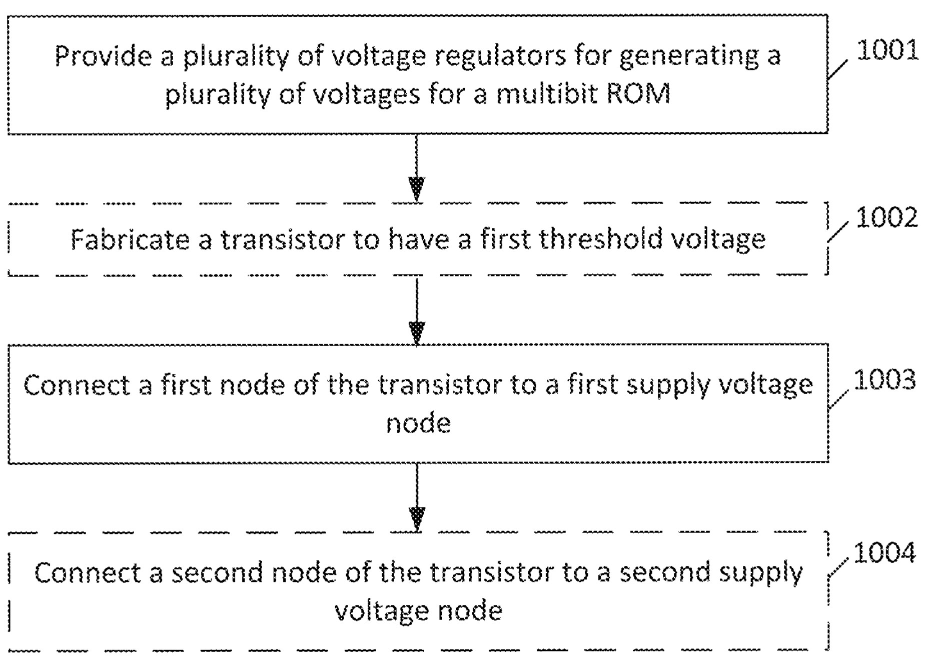
FIG. 10 illustrates an example of a method for storing a multibit ROM cell in accordance with specific embodiments of the inventions disclosed herein.

FIG. 10 illustrates an example of method 1000 for storing a multibit ROM cell in accordance with specific embodiments of the inventions disclosed herein. The value of the multibit ROM may be stored in the form of a connectivity state or a conductivity state of a transistor. Portions of method 1000 may be omitted, duplicated, or rearranged.

At 1001, a plurality of voltage regulators may be provided. The plurality of voltage regulators may generate a plurality of voltages for a multibit ROM.

In specific embodiments, at 1002, a transistor of the multibit ROM may be fabricated to have a first threshold voltage. A second transistor of the multibit ROM may be fabricated to have a second threshold voltage. The second transistor may be part of a different multibit ROM cell than the transistor. The second threshold voltage may be different than the first threshold voltage. The value of the multibit ROM may be stored as a conductivity state of the transistor.

At 1003, a first node of the transistor and a first supply voltage node may be connected. The first supply voltage node may be biased by one of the voltages in the plurality of voltages (e.g., generated at 1001). The transistor may be in a multibit ROM cell of the multibit ROM. A value of the multibit ROM may be stored as a connectivity state or a conductivity state of the transistor. The first node of the transistor and the first supply voltage may be connected by connecting one of a set of wires extending from the first node to the first supply voltage node. The first node and the first supply voltage may be connected (e.g., some or all steps associated with the connecting) during fabrication of a wiring layer of an integrated circuit on which the multibit ROM is located. Connecting (e.g., the process of connecting) the first node and the first supply voltage may use one or more masks that are unique to a programmed state of the multibit ROM.

In specific embodiments, at 1004, a second node of the transistor and a second supply voltage node may be connected. The second supply voltage node may be biased by one of the voltages in the plurality of voltages (e.g., those provided at 1001). The value of the multibit ROM cell may be stored as a conductivity state or a connectivity state of the transistor. The second supply voltage node may be biased by a different voltage than the voltage that biases the first supply voltage node. The second supply voltage node may be biased by the same voltage that biases the first supply voltage node. A value of the multibit ROM cell may be stored as a conductivity state of the transistor. The second node of the transistor and the second supply voltage may be connected by connecting one of a set of wires extending from the second node to the second supply voltage node. The second node and the second supply voltage may be connected (e.g., some or all steps associated with the connecting) during fabrication of a wiring layer of an integrated circuit on which the multibit ROM is located. Connecting (e.g., the process of connecting) the second node and the second supply voltage may use one or more masks that are unique to a programmed state of the multibit ROM.

In specific embodiments of the inventions disclosed herein, by using a plurality of biases, a single circuit element can store multiple bits (e.g., as a connectivity state) in place of a similar circuit element which would otherwise have stored a single bit of information in a traditional ROM cell. ROM arrays in accordance with these embodiments can exhibit much higher information densities as compared to traditional ROM arrays. Integrated ROM storage could be provided on an integrated circuit in close proximity to the computational elements of the integrated circuit.

Figure 11:
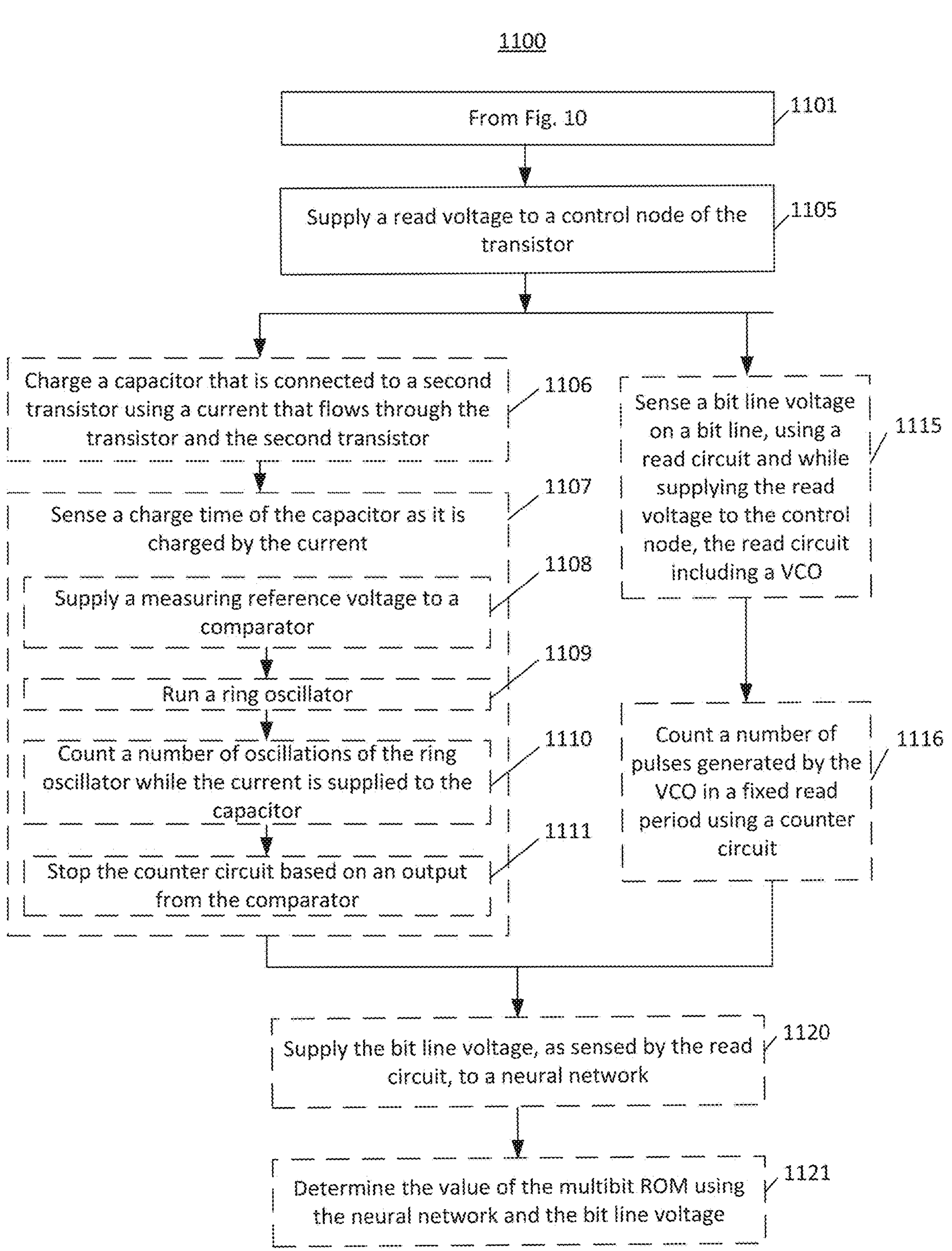
FIG. 11 illustrates an example of a method for reading a multibit ROM cell in accordance with specific embodiments of the inventions disclosed herein.

FIG. 11 illustrates an example of method 1100 for reading a multibit ROM cell in accordance with specific embodiments of the inventions disclosed herein. The value of the multibit ROM may be stored in the form of a connectivity state or a conductivity state of a transistor. Portions of method 1100 may be omitted, duplicated, or rearranged.

At 1101, the value of the multibit ROM may be written in accordance with method 1000 of FIG. 10.

At 1105, a read voltage may be supplied to a control node (e.g., gate) of a transistor. The read voltage may be a read signal. The read signal may be applied to a gate of a first transistor in embodiments in which the multibit ROM cell only has one transistor, or to the gate of a second transistor in embodiments in which the multibit ROM cell has two transistors. The read signal may be a read voltage and the gate of the second transistor may be a control node of the second transistor. The second transistor may be connected to a third node of the transistor and a capacitor. The transistor may be a storage transistor. The second transistor may be a read transistor. In specific embodiments, the read transistor and the storage transistor may be the same transistor. The capacitor may be a read capacitor. The capacitor (e.g., read capacitor) may be shared by at least one other multibit memory cell in in the multibit ROM. The capacitor may be a parasitic capacitor of a bit line.

At 1106, the capacitor may be charged. The capacitor may be charged using a current that flows through the transistor and the second transistor. The capacitor may be connected to the second transistor.

At 1107, a charge time of the capacitor may be sensed. The charge time may relate to the duration of time that the capacitor is charged by the current. To sense the charge time of the capacitor, at 1108, a measuring reference voltage may be supplied to a comparator. The comparator may be connected to the capacitor. To sense the charge time of the capacitor, at 1109, a ring oscillator may be run. To sense the charge time of the capacitor, at 1110, a number of oscillations of the ring oscillator may be counted. The number of oscillations may be counted while the current is supplied to the capacitor. To sense the charge time of the capacitor, at 1111, the counter circuit may be stopped. The counter circuit may be stopped based on an output from the comparator. There are multiple ways in which the value stored in the multibit ROM cell may be read.

In specific embodiments, from the step of supplying a read voltage to a control node of the transistor (e.g., 1105), at 1115, a bit line voltage on a bit line may be sensed. A read circuit may be used to sense the bit line voltage. The read voltage (e.g., from 1105) may be supplied to the control node while the bit line voltage is sensed. The bit line may be connected to a second node of the transistor. The read circuit may comprise a set of comparators. Each comparator in the set of comparators may have an input biased by a voltage regulator in the plurality of voltage regulators in a one-to-one correspondence. The read circuit may comprise a voltage-controlled oscillator (VCO). The bit line may be coupled to an input to the VCO.

In specific embodiments, at 1116, a number of pulses generated by the VCO may be counted. The number of pulses may be counted in a fixed read period using a counter circuit.

Regardless of whether a counter counts a number of oscillations of a ring circuit (e.g., at 1110), a counter counts a number of pulses generated by a VCO in a fixed read period (e.g., at 1116), or information about the stored value of the transistor is gathered via some other means, a neural network may be used to denoise the output. In specific embodiments, at 1120, the bit line voltage may be supplied to a neural network. The neural network may be trained on the multibit ROM.

In specific embodiments, at 1121, the value of the multibit ROM may be determined. For example, the value of the multibit ROM may be determined using the neural network and the bit line voltage.

In specific embodiments of the inventions disclosed herein, by using a plurality of biases, a single circuit element can store multiple bits (e.g., as a conductivity state) in place of a similar circuit element which would otherwise have stored a single bit of information in a traditional ROM cell. ROM arrays in accordance with these embodiments can exhibit much higher information densities as compared to traditional ROM arrays. Integrated ROM storage could be provided on an integrated circuit in close proximity to the computational elements of the integrated circuit.

While the specification has been described in detail with respect to specific embodiments of the invention, it will be appreciated that those skilled in the art, upon attaining an understanding of the foregoing, may readily conceive of alterations to, variations of, and equivalents to these embodiments. Any of the method steps discussed above can be conducted by a processor operating with a computer-readable non-transitory medium storing instructions for those method steps. The computer-readable medium may be memory within a personal user device or a network accessible memory. Although examples in the disclosure were generally directed to ROMs, the same approaches could be utilized to programmable memories. For example, the connections between the nodes of the transistors and the reference voltages could be programmably configurable instead of being formed during fabrication of the memory such as be being based on fuses, phase change material, or transistors with floating gates that can be programmed by tunneling electrons to the gates. These and other modifications and variations to the present invention may be practiced by those skilled in the art, without departing from the scope of the present invention, which is more particularly set forth in the appended claims.

What is claimed is:

1. A method comprising:

providing a plurality of voltage regulators for generating a plurality of voltages for a multibit read only memory; and connecting a first node of a transistor to a first supply voltage node, wherein the first supply voltage node is selected from a plurality of supply voltage nodes each biased by a respective voltage in the plurality of voltages, wherein the transistor is in a multibit read only memory cell of the multibit read only memory, and wherein a value of the multibit read only memory cell is stored as a connectivity state of the transistor determined by the selected first supply voltage node.

2. The method of claim 1, further comprising:

fabricating the transistor to have a first threshold voltage wherein a second transistor in the multibit read only memory has a different second threshold voltage, and the value of the multibit read only memory cell is stored as a conductivity state of the transistor.

3. The method of claim 1, further comprising:

connecting a second node of the transistor to a second supply voltage node, wherein the second supply voltage node is biased by one of the voltages in the plurality of voltages;

wherein the value of the multibit read only memory cell is stored as a conductivity state of the transistor.

4. The method of claim 1, further comprising:

supplying a read voltage to a control node of the transistor; and sensing a bit line voltage on a bit line, using a read circuit and while supplying the read voltage to the control node, wherein the bit line is connected to a second node of the transistor.

5. The method of claim 4, further comprising:

supplying the bit line voltage, as sensed by the read circuit, to a neural network, wherein the neural network has been trained on the multibit read only memory; and determining the value of the multibit read only memory using the neural network and the bit line voltage.

6. The method of claim 4, wherein:

the read circuit comprises a set of comparators, and each comparator in the set of comparators has an input biased by a voltage regulator in the plurality of voltage regulators in a one-to-one correspondence.

7. The method of claim 4, wherein:

the read circuit comprises a voltage-controlled oscillator, and the bit line is coupled to an input to the voltage-controlled oscillator.

8. The method of claim 7, further comprising:

counting a number of pulses generated by the voltage-controlled oscillator in a fixed read period using a counter circuit.

9. A multibit read only memory comprising:

a plurality of voltage generators for generating a plurality of voltages;

a transistor having a first node and a second node; and a connection from the first node to a first supply voltage node, wherein the first supply voltage node is selected from a plurality of supply voltage nodes each biased by a respective voltage in the plurality of voltages, wherein a value of a multibit read only memory cell in the multibit read only memory is stored as a connectivity state of the transistor determined by the selected first supply voltage node.

10. The multibit read only memory of claim 9, further comprising:

a control node of the transistor;

a bit line connected to the second node of the transistor; and a read circuit to sense a voltage on the bit line while supplying a voltage to the control node of the transistor.

11. The multibit read only memory of claim 10, further comprising:

a neural network trained on the multibit read only memory and configured to be supplied with the bit line voltage, as sensed by the read circuit, to determine the value of the multibit read only memory.

12. The multibit read only memory of claim 10, wherein:

the read circuit comprises a set of comparators, and each comparator in the set of comparators has an input biased by a voltage generator in the plurality of voltage generators in a one-to-one correspondence.

13. The multibit read only memory of claim 10, wherein:

the read circuit comprises a voltage-controlled oscillator, and the bit line is coupled to an input to the voltage-controlled oscillator.

14. The multibit read only memory of claim 13, further comprising:

a counter circuit configured to count a number of pulses generated by the voltage controlled oscillator in a fixed read period.

15. A method comprising:

providing a plurality of voltage regulators for generating a plurality of voltages for a multibit read only memory;

connecting a first node of a transistor to a first supply voltage node, wherein the first supply voltage node is independently selected from among a first plurality of supply voltage nodes biased by a respective voltage in the plurality of voltages, and wherein the transistor is in a multibit read only memory cell of the multibit read only memory; and connecting a second node of the transistor to a second supply voltage node, wherein the second supply voltage node is independently selected from among a second plurality of supply voltage nodes biased by a respective voltage in the plurality of voltages, wherein a value of the multibit read only memory cell is stored as a conductivity state of the transistor resulting from the independently selected first supply voltage node and the independently selected second supply voltage node.

16. The method of claim 15, wherein the connecting steps comprise:

connecting one of a set of wires extending from the first node to the first supply voltage node; and connecting one of a set of wires extending from the second node to the second supply voltage node.

17. The method of claim 15, wherein:

the connecting steps are conducted during fabrication of a wiring layer of an integrated circuit on which the multibit read only memory is located; and the connecting steps use one or more masks that are unique to a programmed state of the multibit read only memory.

18. The method of claim 15, further comprising reading the multibit read only memory cell by:

applying a read signal to a gate of a second transistor, wherein the second transistor is connected to: (i) a third node of the transistor; and (ii) a capacitor; charging the capacitor using a current that flows through the transistor and the second transistor; and sensing a charge time of the capacitor as it is charged by the current.

19. The method of claim 18, wherein:

the transistor is a storage transistor;

the second transistor is a read transistor;

the capacitor is a read capacitor; and the read capacitor is shared by at least one other multibit memory cell in the multibit read only memory.

20. The method of claim 18, wherein:

the transistor is a storage transistor;

the second transistor is a read transistor; and the capacitor is a parasitic capacitor of a bit line.

21. The method of claim 18, wherein sensing the charge time of the capacitor comprises:

supplying a measuring reference voltage to a comparator, wherein the comparator is connected to the capacitor;

running a ring oscillator;

counting, using a counter circuit, a number of oscillations of the ring oscillator while the current is supplied to the capacitor; and stopping the counter circuit based on an output from the comparator.

22. A multibit read only memory comprising:

a plurality of voltage generators for generating a plurality of voltages;

a transistor having a first node and a second node;

a connection from the first node to a first supply voltage node wherein the first supply voltage node is independently selected from among a first plurality of supply voltage nodes biased by a respective voltage in the plurality of voltages; and a connection from the second node to a second supply voltage node wherein the second supply voltage node is independently selected from among a second plurality of supply voltage nodes biased by a respective voltage in the plurality of voltages, wherein a value of a multibit read only memory cell in the multibit read only memory is stored as a conductivity state of the transistor resulting from the independently selected first supply voltage node and the independently selected second supply voltage node.

23. The multibit read only memory of claim 22, further comprising:

a plurality of transistors, wherein the transistor is in the plurality of transistors; and a plurality of connections from a plurality of first nodes of the plurality of transistors to a plurality of supply voltage nodes, wherein the plurality of supply voltage nodes are biased by the plurality of voltages.

24. The multibit read only memory of claim 22, wherein:

the first node is one of a drain of the transistor and a source of the transistor; and the second node is a gate of the transistor.

25. The multibit read only memory of claim 22, further comprising:

a set of wires extending from the first node, wherein each wire in the set of wires extending from the first node is uniquely associated with one voltage in the plurality of voltages, and wherein the connection from the first node to the first supply voltage node includes a wire from the set of wires extending from the first node and a programmed connection to the first supply voltage node; and a set of wires extending from the second node, wherein each wire in the set of wires extending from the second node is uniquely associated with one voltage in the plurality of voltages, and wherein the connection from the second node to the second supply voltage node includes a wire from the set of wires extending from the second node and a programmed connection to the second supply voltage node.

26. The multibit read only memory of claim 22, wherein the connection to the second supply voltage node and the connection to the first supply voltage node are both wires formed by one or more masks that are unique to a programmed state of the multibit read only memory cell.

27. The multibit read only memory of claim 22, further comprising:

a wire extending from the first node, wherein the wire extending from the first node includes a set of tap points, and wherein the tap points in the set of tap points in the wire extending from the first node are each uniquely configured to be connected to one voltage in the plurality of voltages; and a wire extending from the second node, wherein the wire extending from the second node includes a set of tap points, and wherein the tap points in the set of tap points in the wire extending from the second node are each uniquely configured to be connected to one voltage in the plurality of voltages.

28. The multibit read only memory of claim 22, further comprising:

a second transistor, wherein the second transistor is connected to a third node of the transistor;

a capacitor, wherein the capacitor, the transistor, and the second transistor are coupled such that a current that flows through the transistor and the second transistor charges the capacitor; and a sensing circuit configured to sense a charge time of the capacitor as it is charged by the current.

29. The multibit read only memory of claim 28, wherein:

the transistor is a storage transistor;

the second transistor is a read transistor;

the capacitor is a read capacitor; and the read capacitor is shared by at least one other multibit memory cell in the multibit read only memory.

30. The multibit read only memory of claim 28, wherein the sensing circuit comprises:

a comparator coupled to a reference voltage and the capacitor;

a ring oscillator; and a counter circuit coupled to an output of the comparator and the ring oscillator.

31. The multibit read only memory of claim 28, wherein:

the transistor is a storage transistor;

the second transistor is a read transistor; and the capacitor is a parasitic capacitor of a bit line.

* * * * *